US009112024B2

(12) United States Patent
Onogi et al.

(10) Patent No.: US 9,112,024 B2
(45) Date of Patent: Aug. 18, 2015

(54) SEMICONDUCTOR DEVICE

(75) Inventors: Atsushi Onogi, Toyota (JP); Hiroomi Eguchi, Seto (JP); Takashi Okawa, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/111,704

(22) PCT Filed: May 17, 2011

(86) PCT No.: PCT/JP2011/002741
§ 371 (c)(1),
(2), (4) Date: Oct. 14, 2013

(87) PCT Pub. No.: WO2012/157025
PCT Pub. Date: Nov. 22, 2012

(65) Prior Publication Data
US 2014/0035036 A1 Feb. 6, 2014

(51) Int. Cl.
| H01L 29/66 | (2006.01) |
| H01L 29/78 | (2006.01) |
| H01L 29/739 | (2006.01) |
| H01L 29/06 | (2006.01) |
| H01L 29/08 | (2006.01) |
| H01L 29/40 | (2006.01) |
| H01L 29/423 | (2006.01) |

(52) U.S. Cl.
CPC ........ *H01L 29/7816* (2013.01); *H01L 29/0634* (2013.01); *H01L 29/0696* (2013.01); *H01L 29/0878* (2013.01); *H01L 29/7394* (2013.01); *H01L 29/7824* (2013.01); *H01L 29/402* (2013.01); *H01L 29/42368* (2013.01)

(58) Field of Classification Search
None
See application file for complete search history.

(56) References Cited

U.S. PATENT DOCUMENTS

| 6,297,534 B1 | 10/2001 | Kawaguchi et al. | |
| 2002/0030225 A1* | 3/2002 | Nakamura et al. | 257/338 |
| 2003/0183858 A1* | 10/2003 | Kitagawa et al. | 257/288 |
| 2009/0184370 A1 | 7/2009 | Taki et al. | |
| 2010/0025763 A1 | 2/2010 | Paul et al. | |

FOREIGN PATENT DOCUMENTS

| GB | 2 309 336 A | 7/1997 |
| JP | 8 236754 | 9/1996 |

(Continued)

OTHER PUBLICATIONS

International Search Report Issued Jul. 19, 2011 in PCT/JP11/002741 Filed May 17, 2011.

*Primary Examiner* — Bilkis Jahan
*Assistant Examiner* — Kevin Quinto
(74) *Attorney, Agent, or Firm* — Oblon, McClelland, Maier & Neustadt, L.L.P.

(57) ABSTRACT

A lateral semiconductor device including a semiconductor substrate; a buried oxide layer formed on the semiconductor substrate, and an active layer formed on the buried oxide layer. The active layer includes a first conductivity type well region, a second conductivity type well region, and a first conductivity type drift region interposed between the first conductivity type well region and the second conductivity type well region. A region where current flows because of carriers moving between the first conductivity type well region and the second conductivity type well region, and a region where no current flows are formed alternately between the first conductivity type well region and the second conductivity type well region, in a direction perpendicular to a carrier moving direction when viewed in a plan view.

7 Claims, 26 Drawing Sheets

(56) References Cited

FOREIGN PATENT DOCUMENTS

| JP | 11 251597 | 9/1999 |
| JP | 2001 15741 | 1/2001 |
| JP | 2004 6731 | 1/2004 |
| JP | 2007 173422 | 7/2007 |

* cited by examiner

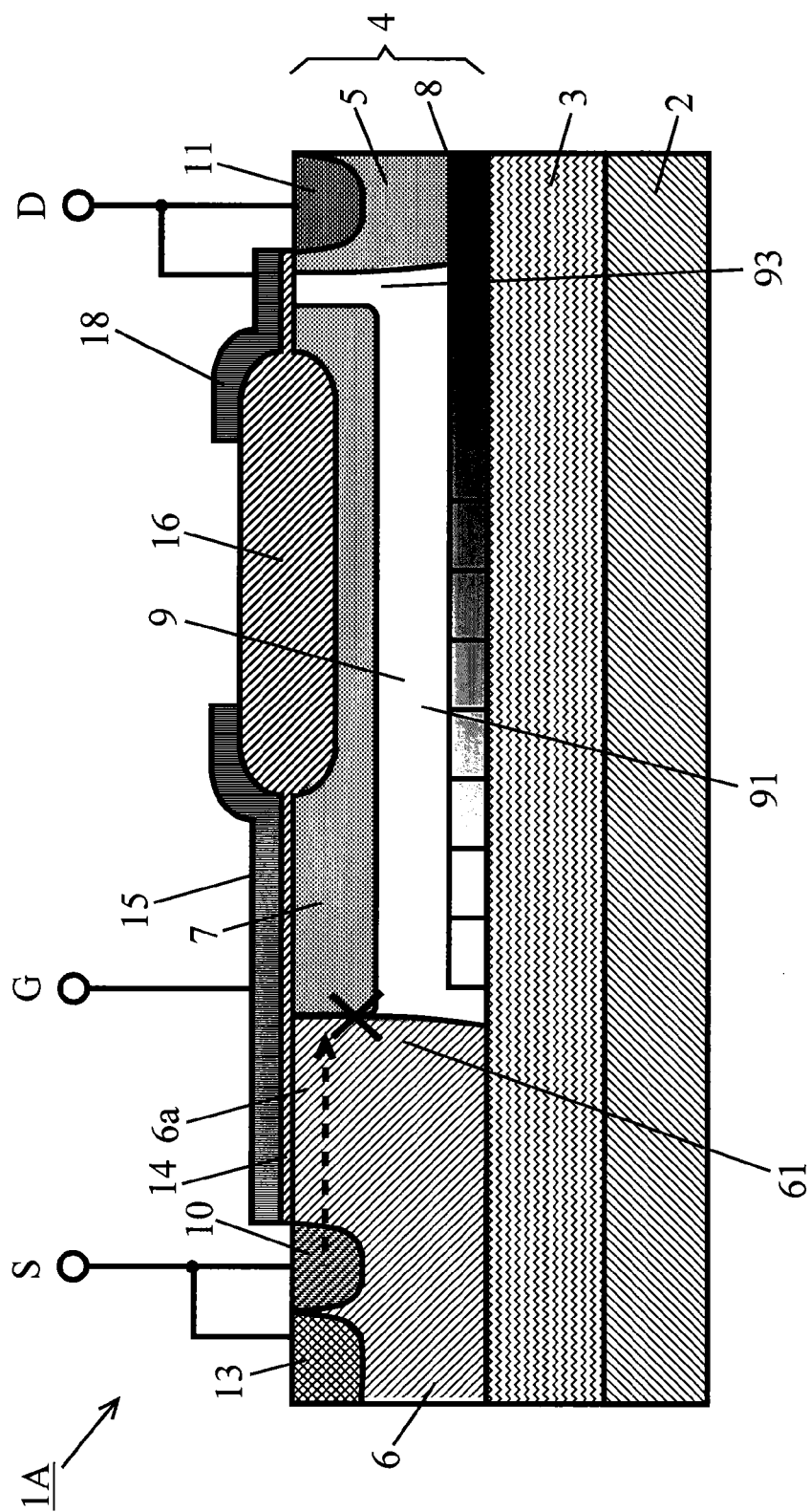
F I G. 6

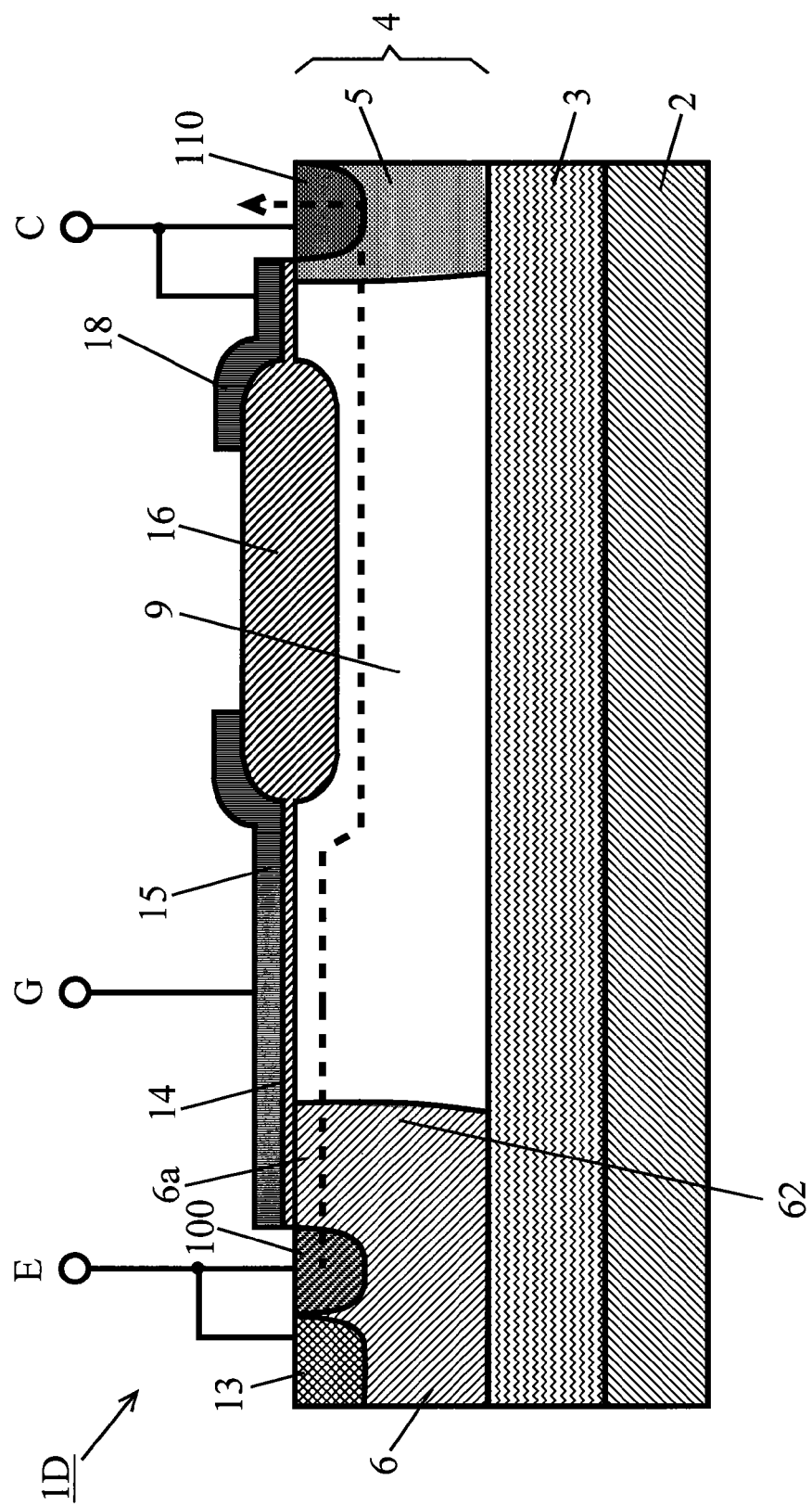
F I G. 14

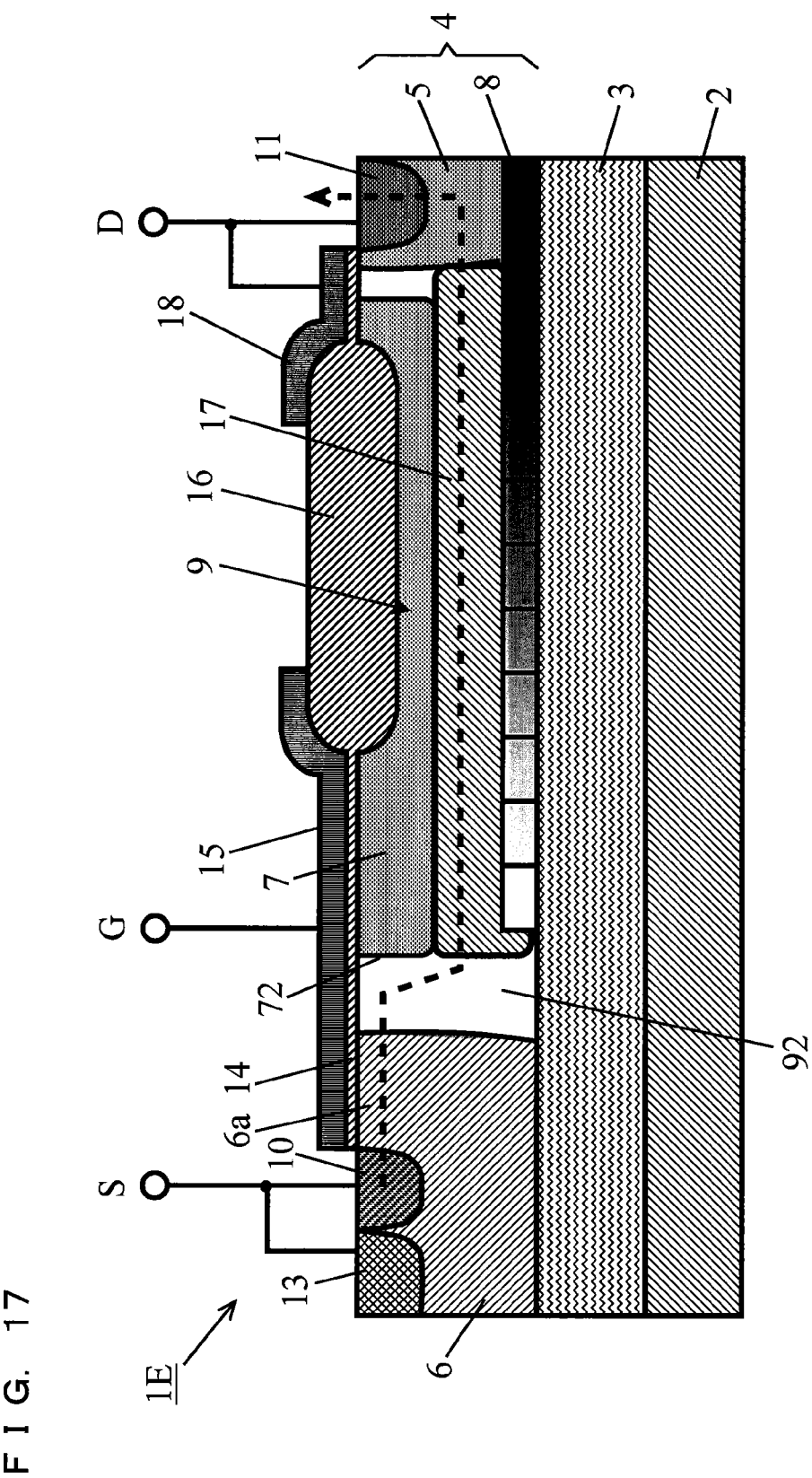
F I G. 17

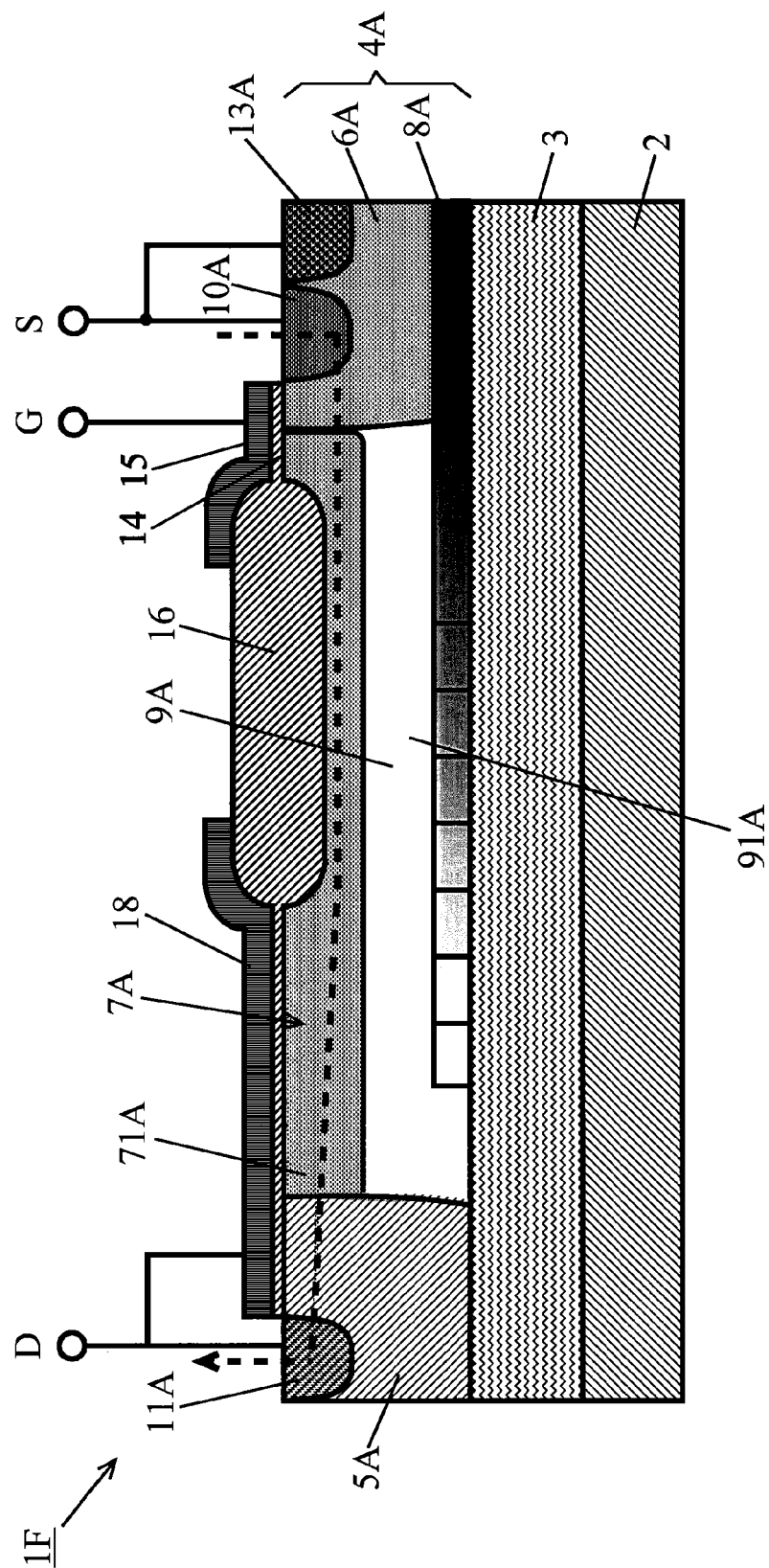
F I G. 21

SEMICONDUCTOR DEVICE

TECHNICAL FIELD

The present invention relates to a semiconductor device, and more specifically to a semiconductor device that is able to prevent deterioration in forward breakdown voltage caused by heat and that facilitates downsizing of the semiconductor device.

BACKGROUND ART

A conventionally known lateral semiconductor device has an SOI (Silicon On Insulator) substrate formed of lamination of a semiconductor substrate, a buried oxide layer, and an active layer, and has a pair of main electrodes formed on the surface of the active layer. The lateral semiconductor device utilizing the SOI substrate is characteristically less prone to malfunction caused by a surge voltage, and is expected to be a promising semiconductor device.

An example of the above-described semiconductor device is disclosed by patent literature 1. FIG. 25 schematically shows a plan view of essential parts of a lateral n-type channel LDMOS (Laterally Diffused MOS) 1000 described in patent literature 1. FIG. 26 is a cross-sectional view of the LDMOS shown in FIG. 25 taken along line A-A. It should be noted that electrodes and field oxide layer shown in FIG. 26 are not shown in FIG. 25.

The LDMOS 1000 includes a semiconductor substrate 200 made of a single crystal silicon containing a p-type impurity in a high concentration, a buried oxide layer 300 made of silicon oxide ($SiO_2$) and disposed on the semiconductor substrate 200, and an active layer 140 made of a single crystal silicon and disposed on the buried oxide layer 300.

The active layer 140 includes an n-type well semiconductor region 50, a p-type well semiconductor region 60, a surface semiconductor layer 70, a bottom semiconductor layer 80, an intermediate semiconductor layer 90, and a source semiconductor region 101.

The n-type well semiconductor region 50 is a semiconductor region surrounding an n-type drain semiconductor region 102. The p-type well semiconductor region 60 is a semiconductor region surrounding the n-type source semiconductor region 101.

The surface semiconductor layer 70 is formed in a part of the top surface of the active layer 140, and is interposed between the n-type well semiconductor region 50 and the p-type well semiconductor region 60. According to the plan view (see FIG. 25), the p-type well semiconductor region 60 and the surface semiconductor layer 70 are entirely isolated from each other. The surface semiconductor layer 70 contains a p-type impurity (typically boron). The surface semiconductor layer 70 is electrically connected to a source terminal S via a contact semiconductor region 70a.

The bottom semiconductor layer 80 is formed in a part of the bottom surface side of the active layer 140, interposed between the n-type well semiconductor region 50 and the p-type well semiconductor region 60, and isolated by the intermediate semiconductor layer 90 from the surface semiconductor layer 70. The bottom semiconductor layer 80 has contact with the n-type well semiconductor region 50, and is isolated from the p-type well semiconductor region 60. The bottom semiconductor layer 80 contains an n-type impurity (typically phosphorus). The impurity concentration in the bottom semiconductor layer 80 decreases from its surface joining the buried oxide layer 300 toward its top surface.

The LDMOS 1000 includes the surface semiconductor layer 70, the intermediate semiconductor layer 90, and the bottom semiconductor layer 80, and accordingly, the critical voltage at an interface between the active layer 140 and the buried oxide layer 300 can be increased, and the breakdown voltage per unit thickness of the buried oxide layer 300 can be improved. The surface semiconductor layer 70, the intermediate semiconductor layer 90, and the bottom semiconductor layer 80 form a so-called RESURF (Reduced Surface Field) structure.

However, the semiconductor devices described in above patent literature 1 pose the following problems. That is, since the p-type well semiconductor region 60 and the surface semiconductor layer 70 are entirely isolated from each other as viewed in the plan view, current flows in the entire area between the p-type well semiconductor region 60 and the n-type well semiconductor region 50 in the plan view. Thus, in the n-type drain semiconductor region 102, a current amount per unit area increases (causing current crowding), and consequently the n-type drain semiconductor region 102 produces a high-temperature heat. As a result, a problem of deterioration in forward breakdown voltage of LDMOS 1000 has been posed. In particular, in the case of designing the LDMOS 1000 as a level-shifting device, the drain side is set as a high potential side, and thus a large amount of saturation current flows to the drain side. If such a large amount of saturation current flows, the current concentrates at the drain region, of which temperature is rising, and consequently the problem of deterioration in forward breakdown voltage is caused.

In addition, in order to set the surface semiconductor layer 70 and the source semiconductor region 101 to have the same electric potential, the contact semiconductor region 70a needs to be formed in the surface semiconductor layer 70. With this formation of the contact semiconductor region 70a, the dimensions of the LDMOS 1000 are increased, resulting in a problem of having difficulty in downsizing the LDMOS 1000.

CITATION LIST

Patent Literature

[PTL 1] Japanese laid-open application publication No. 2007-173422

SUMMARY OF THE INVENTION

Problems to be Solved by the Invention

The present invention has been made in view of the above-described circumstances, and is directed to provide a semiconductor device that is able to prevent deterioration in forward breakdown voltage caused by heat and that facilitates downsizing.

Solution to the Problems

In order to solve the above-described problems, the present invention adopts the following configuration.

A first aspect is a lateral semiconductor device, comprising:
a semiconductor substrate;
a buried oxide layer formed on the semiconductor substrate; and
an active layer formed on the buried oxide layer, the active layer comprising:
  a second conductivity type well region surrounding a first conductivity type source region;
  a first conductivity type well region surrounding a first conductivity type drain region;
  a first conductivity type drift region interposed between the second conductivity type well region and the first conductivity type well region; and
  a gate electrode formed in a part of a surface of the active layer via a gate dielectric layer which has contact with a surface of the second conductivity type well region and a surface of the first conductivity type drift region, wherein
  the second conductivity type well region partially extends along the gate dielectric layer, longer in a direction in which carriers move than a length of the gate dielectric layer, into the first conductivity type drift region.

According to the first aspect of the present invention, it is possible to prevent deterioration in breakdown voltage of the semiconductor device. In addition, downsizing of the semiconductor device can be realized.

More specifically, no carrier flows from the first conductivity type source region to the first conductivity type drain region through a part where the second conductivity type well region extends (see FIGS. 10 and 12), whereas carriers flow from the first conductivity type source region to the first conductivity type drain region through a part where the second conductivity type well region does not extend (see FIGS. 10 and 11). Accordingly, a part where current flows and a part where no current flows are formed between the first conductivity type source region and the first conductivity type drain region, and consequently, a current amount per unit area of the first conductivity type drain region can be reduced. Accordingly, a heating value per unit area of the first conductivity type drain region can be reduced, and it is possible to prevent the temperature of the first conductivity type drain region from rising excessively. And it is also possible to prevent deterioration in breakdown voltage of the semiconductor device.

Further, since no surface semiconductor layer is provided, it is unnecessary to form a contact semiconductor region in the surface semiconductor layer, and thus the semiconductor device can be downsized.

A second aspect of the present invention is a lateral semiconductor device, comprising:
  a semiconductor substrate;
  a buried oxide layer formed on the semiconductor substrate; and
  an active layer formed on the buried oxide layer,
  the active layer comprising:
  a second conductivity type well region surrounding a first conductivity type emitter region;
  a first conductivity type well region surrounding a second conductivity type collector region;
  a first conductivity type drift region interposed between the second conductivity type well region and the first conductivity type well region; and
  a gate electrode formed in a part of a surface of the active layer via a gate dielectric layer which has contact with a surface of the second conductivity type well region and a surface of the first conductivity type drift region, wherein
  the second conductivity type well region partially extends along the gate dielectric layer, longer in a direction in which carriers move than a length of the gate dielectric layer, into the first conductivity type drift region.

According to the second aspect of the present invention, it is possible to prevent deterioration in breakdown voltage of the semiconductor device. In addition, downsizing of the semiconductor device can be realized.

More specifically, no carrier flows from the first conductivity type emitter region to the second conductivity type collector region through a part where the second conductivity type well region extends (see FIGS. 13 and 15), whereas carriers flow from the first conductivity type emitter region to the second conductivity type collector region through a part where the second conductivity type well region does not extend (see FIGS. 13 and 14). Accordingly, a part where current flows and a part where no current flows are formed between the first conductivity type emitter region and the second conductivity type collector region, and consequently, a current amount per unit area of the second conductivity type collector region can be reduced. Accordingly, a heating value per unit area of the second conductivity type collector region can be reduced, and it is possible to prevent the temperature of the second conductivity type collector region from rising excessively. And it is also possible to prevent deterioration in breakdown voltage of the semiconductor device.

Further, since no surface semiconductor layer is provided, it is unnecessary to form a contact semiconductor region in the surface semiconductor layer, and thus the semiconductor device can be downsized.

A third aspect of the present invention is a lateral semiconductor device, comprising:
  a semiconductor substrate;
  a buried oxide layer formed on the semiconductor substrate; and
  an active layer formed on the buried oxide layer,
  the active layer comprising:
  a second conductivity type well region surrounding a first conductivity type source region;
  a first conductivity type well region surrounding a first conductivity type drain region;
  a first conductivity type drift region interposed between the second conductivity type well region and the first conductivity type well region; and
  a gate electrode formed in a part of a surface of the active layer via a gate dielectric layer which has contact with a surface of the second conductivity type well region and a surface of the first conductivity type drift region, wherein
  in a surface part of the first conductivity type drift region, a second conductivity type surface layer having contact with the gate dielectric layer is laminated, and
  a part of the second conductivity type surface layer and a part of the second conductivity type well region have contact with each other.

According to the third aspect of the present invention, it is possible to prevent deterioration in breakdown voltage of the semiconductor device. In addition, downsizing of the semiconductor device can be realized.

More specifically, no carrier flows from the first conductivity type source region to the first conductivity type drain region through a part where the second conductivity type surface layer has contact with the second conductivity type well region (see FIGS. 1 and 3), whereas carriers flow from the first conductivity type source region to the first conductivity type drain region through a part where the second conductivity type surface layer has no contact with the second conductivity type well region (see FIGS. 1 and 2). Accordingly, a part where current flows and a part where no current flows are formed between the first conductivity type source region and the first conductivity type drain region, and consequently, a current amount per unit area of the first conductivity type drain region can be reduced. Accordingly, a heating value per unit area of the first conductivity type drain region can be reduced, and it is possible to prevent the temperature of the first conductivity type drain region from rising excessively. And it is possible to prevent deterioration in breakdown voltage of the semiconductor device.

Further, since a part of the second conductivity type surface layer and a part of the second conductivity type well region have contact with each other, the second conductivity type surface layer and the first conductivity type source region have the same electric potential without having a contact semiconductor region in the surface semiconductor layer, and thus, the semiconductor device can be downsized.

A fourth aspect of the present invention is a lateral semiconductor device, comprising:
  a semiconductor substrate;
  a buried oxide layer formed on the semiconductor substrate; and
  an active layer formed on the buried oxide layer,
  the active layer comprising:
    a second conductivity type well region surrounding a first conductivity type emitter region;
    a first conductivity type well region surrounding a second conductivity type collector region;
    a first conductivity type drift region interposed between the second conductivity type well region and the first conductivity type well region; and
    a gate electrode formed in a part of a surface of the active layer via a gate dielectric layer which has contact with a surface of the second conductivity type well region and a surface of the first conductivity type drift region; wherein
  in a surface part of the first conductivity type drift region, a second conductivity type surface layer having contact with the gate dielectric layer is formed, and
  a part of the second conductivity type surface layer and a part of the second conductivity type well region have contact with each other.

According to the fourth aspect of the present invention, it is possible to prevent deterioration in breakdown voltage of the semiconductor device. In addition, downsizing of the semiconductor device can be realized.

More specifically, no carrier flows from the first conductivity type emitter region to the second conductivity type collector region through a part where the second conductivity type surface layer has contact with the second conductivity type well region (see FIGS. 7 and 9), whereas carriers flow from the first conductivity type emitter region to the second conductivity type collector region through a part where the second conductivity type surface layer has no contact with the second conductivity type well region (see FIGS. 7 and 8). Accordingly, a part where current flows and a part where no current flows are formed between the first conductivity type emitter region and the second conductivity type collector region, and consequently, a current amount per unit area of the second conductivity type collector region can be reduced. Accordingly, a heating value per unit area of the second conductivity type collector region can be reduced, and it is possible to prevent the temperature of the second conductivity type collector region from rising excessively. And it is also possible to prevent deterioration in breakdown voltage of the semiconductor device.

Further, since a part of the second conductivity type surface layer has contact with a part of the second conductivity type well region, the second conductivity type surface layer and the first conductivity type source region have the same electric potential without having a contact semiconductor region in the surface semiconductor layer, and thus the semiconductor device can be downsized.

A fifth aspect of the present invention is a lateral semiconductor device, comprising:
  a semiconductor substrate;
  a buried oxide layer formed on the semiconductor substrate; and
  an active layer formed on the buried oxide layer,
  the active layer comprising:
    a first conductivity type well region surrounding a second conductivity type source region;
    a second conductivity type well region surrounding a second conductivity type drain region;
    a first conductivity type drift region interposed between the first conductivity type well region and the second conductivity type well region; and
    a gate electrode formed in a part of a surface of the active layer via a gate dielectric layer which has contact with a surface of the first conductivity type well region and a surface of the first conductivity type drift region, wherein
  in a surface part of the first conductivity type drift region, a second conductivity type surface layer having contact with the gate dielectric layer is formed, and
  a part of the second conductivity type surface layer and a part of the second conductivity type well region have contact with each other.

According to the fifth aspect of the present invention, it is possible to prevent deterioration in breakdown voltage of the semiconductor device. In addition, downsizing of the semiconductor device can be realized.

More specifically, no carrier flows from the second conductivity type source region to the second conductivity type drain region through a part where the second conductivity type surface layer has contact with the second conductivity type well region (see FIGS. 19 and 20), whereas carriers flow from the second conductivity type source region to the second conductivity type drain region through a part where the second conductivity type surface layer has no contact with the first conductivity type well region (see FIGS. 19 and 21). Accordingly, a part where current flows and a part where no current flows are formed between the second conductivity type source region and the second conductivity type drain region, and consequently, a current amount per unit area of the second conductivity type drain region can be reduced. Accordingly, a heating value per unit area of the second conductivity type drain region can be reduced, and it is possible to prevent the temperature of the second conductivity type drain region from rising excessively. And it is also possible to prevent deterioration in breakdown voltage of the semiconductor device.

Further, since a part of the second conductivity type surface layer and a part of the second conductivity type well region have contact with each other, the second conductivity type surface layer and the second conductivity type drain region have the same electric potential, without having a contact semiconductor region in the surface semiconductor layer, and thus, the semiconductor device can be downsized.

A sixth aspect of the present invention is based on any of the third to fifth aspects of the present invention, and characterized in that the part of the second conductivity type surface layer extends along the gate dielectric layer toward the second conductivity type well region.

According to the sixth aspect of the present invention, the breakdown voltage of the semiconductor device can be further improved.

More specifically, since a part of the second conductivity type surface layer extends along the gate dielectric layer to the second conductivity type well region (see FIGS. 1 and 3), a boundary between the second conductivity type surface layer and the second conductivity type well region is further distanced from the drain region or the collector region as compared to a case where a part of the second conductivity type well region extends along the gate dielectric layer to the second conductivity type surface layer (see FIGS. 4 and 6). Accordingly, the length of the depletion layer can be increased, and the breakdown voltage of the semiconductor device can be further improved.

Advantageous Effects of the Invention

According to the present invention, it is possible to provide a semiconductor device that is able to prevent deterioration in breakdown voltage caused by heat and that facilitates downsizing.

BRIEF DESCRIPTION OF THE DRAWINGS

FIG. 6 is a cross-sectional view of the semiconductor device shown in FIG. 4 taken along line B-B.

FIG. 14 is a cross-sectional view of the semiconductor device shown in FIG. 13 taken along line A-A.

FIG. 17 is a cross-sectional view of the semiconductor device shown in FIG. 16 taken along line B-B.

FIG. 21 is a cross-sectional view of the semiconductor device shown in FIG. 19 taken along line A-A.

MODE FOR CARRYING OUT THE INVENTION

First Embodiment

A first embodiment of the present invention will be described with reference to the drawings.

Figure 1:
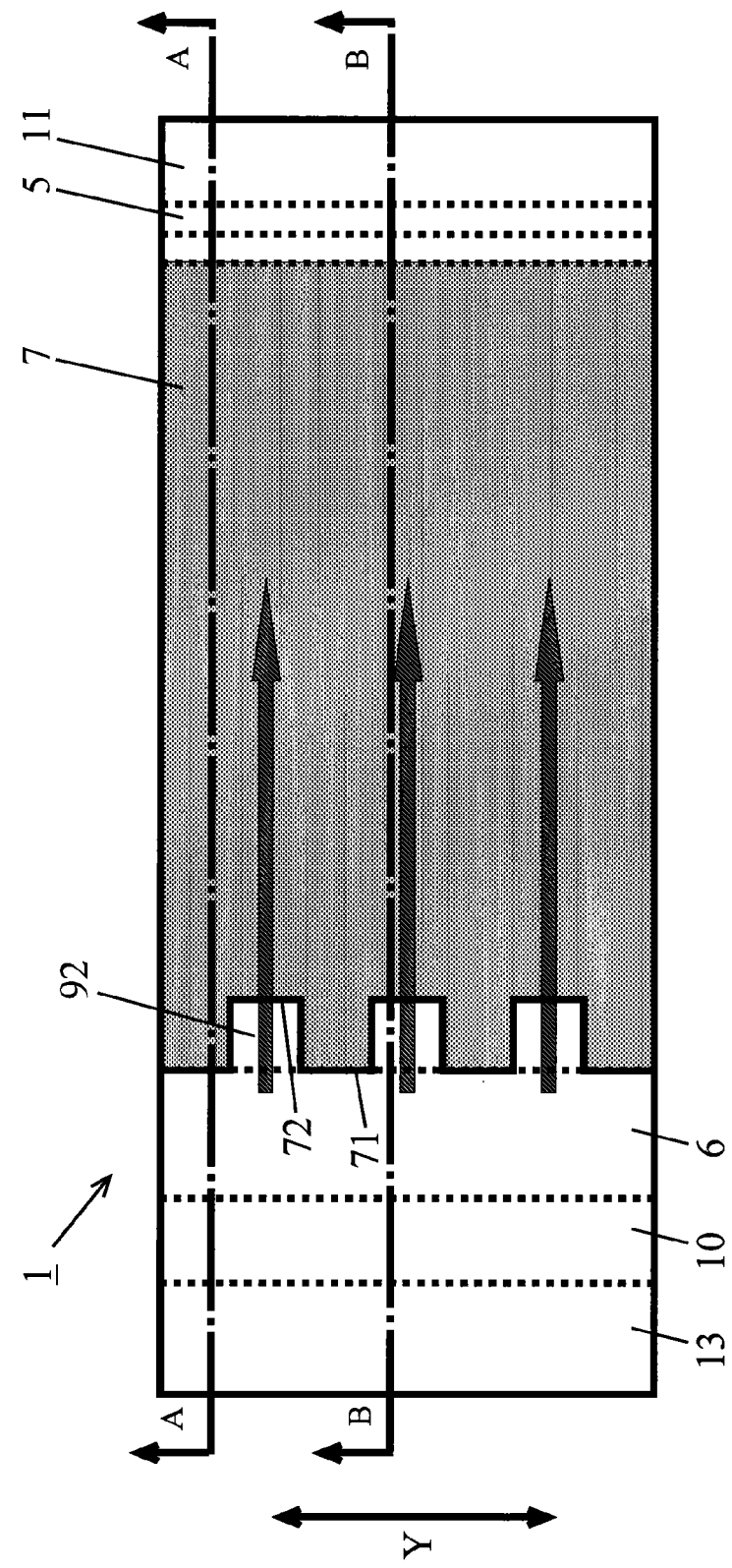
FIG. 1 is a plan view showing essential parts of a semiconductor device according to a first embodiment of the present invention.
Figure 2:
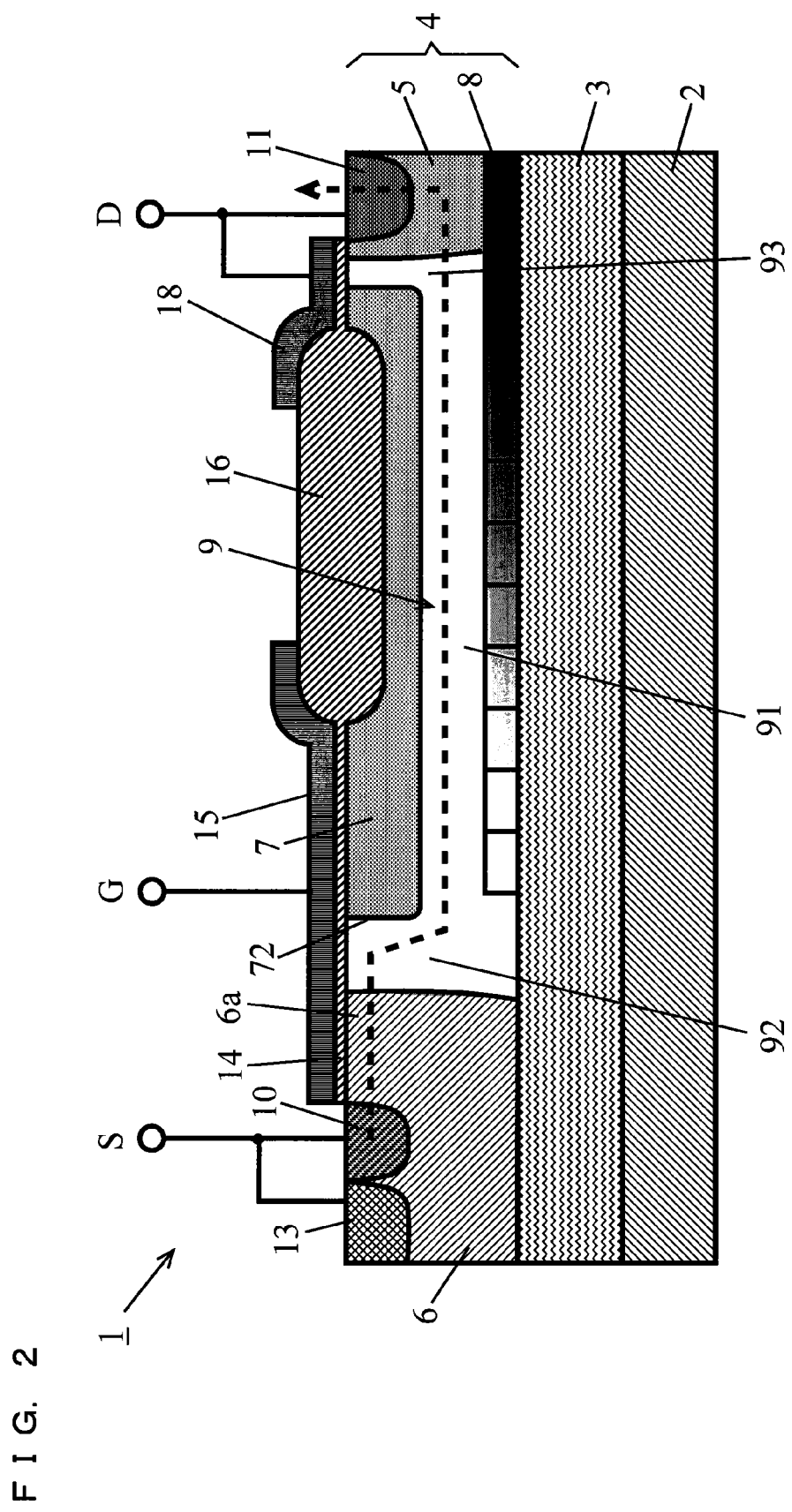
FIG. 2 is a cross-sectional view of the semiconductor device shown in FIG. 1 taken along line B-B.
Figure 3:
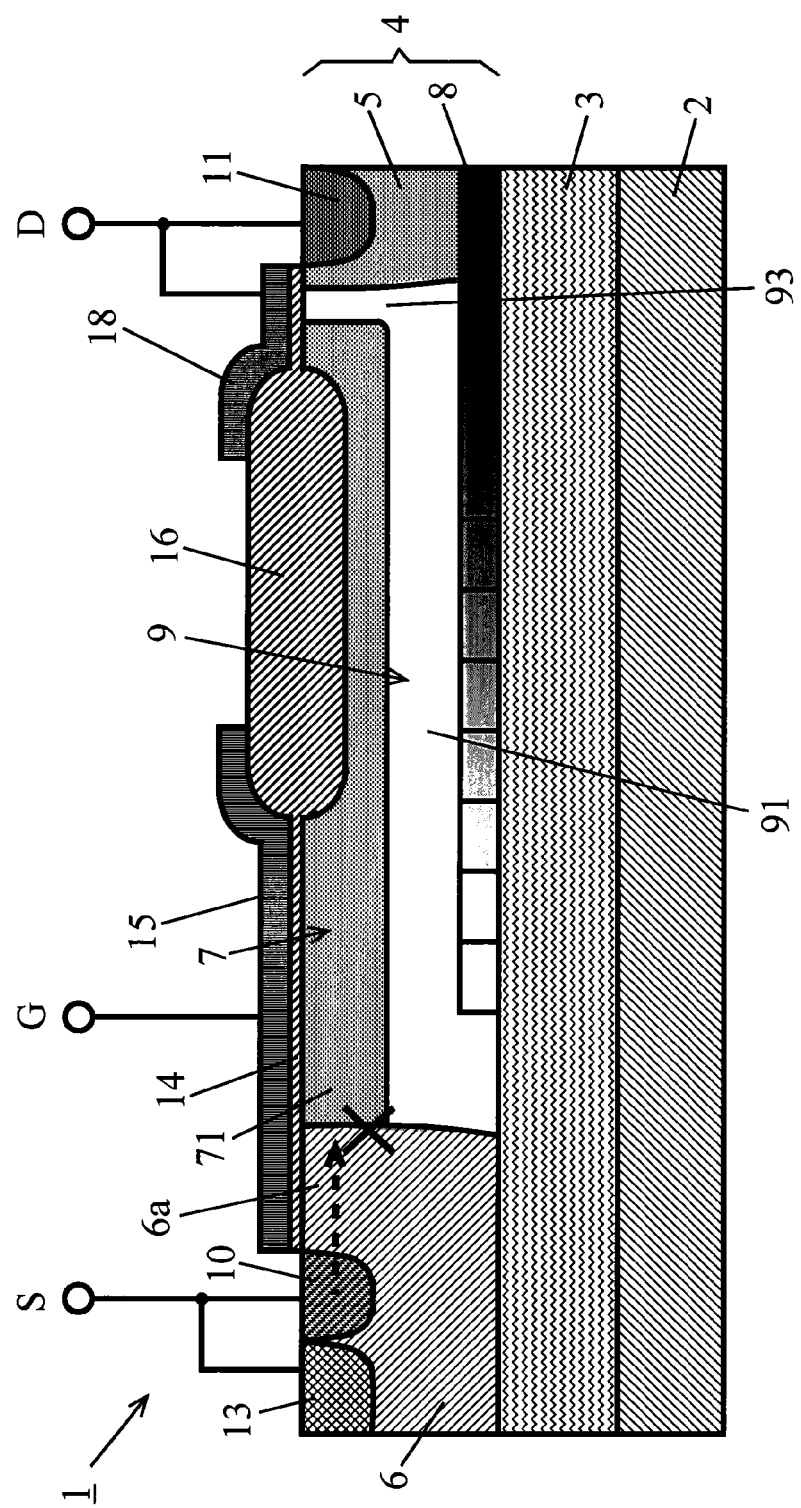
FIG. 3 is a cross-sectional view of the semiconductor device shown in FIG. 1 taken along line A-A.

FIG. 1 is a plan view showing essential parts of a semiconductor device according to a first embodiment of the present invention. FIG. 2 is a cross-sectional view of the semiconductor device shown in FIG. 1 taken along line B-B. FIG. 3 is a cross-sectional view of the semiconductor device shown in FIG. 1 taken along line A-A. It should be noted that no electrodes or field oxide layer are shown in FIG. 1.

In the first embodiment, an exemplary case will be described where a "first conductivity type" and a "second conductivity type" recited in the claims represent an n-type and a p-type, respectively.

A semiconductor device 1 shown in FIGS. 1 to 3 is a lateral n-type channel LDMOS (Laterally Diffused MOS).

Firstly, an outline of the semiconductor device 1 will be described.

The semiconductor device 1 includes a semiconductor substrate 2 made of a single crystal silicon containing a second conductivity type (p-type) impurity in a high concentration, a buried oxide layer 3 made of silicon oxide ($SiO_2$) and formed on the semiconductor substrate 2, and an active layer 4 made of a single crystal silicon and formed on the buried oxide layer 3.

The structure of the active layer 4 is such that a well semiconductor region 6 which is of second conductivity type (p-type) and surrounds a source semiconductor region 10 of first conductivity type (n-type) and a well semiconductor region 5 which is of first conductivity type (n-type) and surrounds a drain semiconductor region 11 of first conductivity type (n-type) are arranged in such a manner as to sandwich a drift region 9 of first conductivity type (n-type).

On a part of a surface of the active layer 4, a gate electrode 15 is formed via a gate dielectric layer 14 which has contact with a surface of the well semiconductor region 6 of second conductivity type and a surface of the drift region 9 of first conductivity type. In the surface part of the active layer 4, there is formed a surface semiconductor layer 7 of second conductivity type (p-type) which has contact with the gate dielectric layer 14. The surface semiconductor layer 7 corresponds to a "second conductivity type surface layer" recited in the claims.

Parts of the surface semiconductor layer 7 and parts of the well semiconductor region 6 of second conductivity type (p-type) have contact with one another.

Hereinafter, the semiconductor device 1 will be described in detail.

The semiconductor substrate 2 may contain the p-type impurity in a high concentration, or may contain an n-type impurity (typically phosphorus) in a high concentration. The semiconductor substrate 2 can substantially be evaluated as a conductive material. In order to maintain the mechanical strength (against warpage or the like) of wafers, the resistivity of the semiconductor substrate 2 is preferably set as low as about 1 to 100 mΩ·cm. The thickness of the buried oxide layer 3 is, for example, set to 3 to 5 µm.

The active layer 4 has the n-type well semiconductor region 5, the p-type well semiconductor region 6, the surface semiconductor layer 7, a bottom semiconductor layer 8, the drift region 9, and the source semiconductor region 10. The thickness of the active layer 4 is, for example, set to about 2.0 to 2.5 µm. With the thickness of 2.0 µm or greater, the ESD withstand capability is less likely to deteriorate. In the present embodiment, for example, a known RESURF structure of which application has previously been filed by the applicant of the present invention may be applied (see Japanese laid-open application publication No. 2007-173422).

The n-type well semiconductor region 5 is formed as a part of the active layer 4, and contains an n-type impurity (typically phosphorus). The impurity concentration in the n-type well semiconductor region 5 is adjusted to approximately $5 \times 10^{16}$ to $5 \times 10^{17}$ cm$^{-3}$. The n-type well semiconductor region 5 includes in its surface part the drain semiconductor region 11 which contains an n-type impurity (typically phosphorus) in a high concentration. The drain semiconductor region 11 can be evaluated as a part of the n-type well semiconductor region 5. The impurity concentration in the drain semiconductor region 11 is adjusted to approximately $1 \times 10^{19}$ to $1 \times 10^{22}$ cm$^{-3}$. The n-type well semiconductor region 5 is electrically connected to a drain terminal D via the drain semiconductor region 11 and a drain electrode (not shown). The n-type well semiconductor region 5 extends from the top surface to the bottom surface of the active layer 4. The semiconductor device 1 has an overlapped region where a part of the n-type well semiconductor region 5 and a part of the bottom semiconductor layer 8 overlap each other.

The p-type well semiconductor region 6 is formed as a part of the active layer 4, and is isolated from the n-type well semiconductor region 5 by the drift region 9. The p-type well semiconductor region 6 contains a p-type impurity (typically boron). The impurity concentration in the p-type well semiconductor region 6 is adjusted to approximately $5 \times 10^{16}$ to $5 \times 10^{17}$ cm$^{-3}$. The p-type well semiconductor region 6 includes in its surface part a well-contacting semiconductor region 13 which contains a p-type impurity (typically boron) in a high concentration. The impurity concentration in the well-contacting semiconductor region 13 is adjusted to approximately $1 \times 10^{19}$ to $1 \times 10^{22}$ cm$^{-3}$. The well-contacting semiconductor region 13 can be evaluated as a part of the p-type well semiconductor region 6. The p-type well semiconductor region 6 is electrically connected to a source electrode S via the well-contacting semiconductor region 13. The p-type well semiconductor region 6 extends from the top surface to the bottom surface of the active layer 4. The p-type well semiconductor region 6 has contact with the buried oxide layer 3.

The source semiconductor region 10 is formed in the surface part of the p-type well semiconductor region 6, and is isolated from the drift region 9 by the p-type well semiconductor region 6. The source semiconductor region 10 contains an n-type impurity (typically phosphorus) in a high concentration. The source semiconductor region 10 is electrically connected to a source terminal S via a source electrode (not shown).

The surface semiconductor layer 7 is formed in the surface part of the active layer 4, and is interposed between the n-type well semiconductor region 5 and the p-type well semiconductor region 6. The surface semiconductor layer 7 contains a p-type impurity (typically boron). The value obtained by integrating the impurity concentrations in the surface semiconductor layer 7 in its thickness direction is adjusted to approximately $1 \times 10^{12}$ to $5 \times 10^{12}$ cm$^{-2}$.

The bottom semiconductor layer 8 is formed in the bottom part of the active layer 4, interposed between the n-type well semiconductor region 5 and the p-type well semiconductor region 6, and is isolated from the surface semiconductor layer 7 by the drift region 9. The bottom semiconductor layer 8 has contact with the n-type well semiconductor region 5 and is distanced from the p-type well semiconductor region 6. The bottom semiconductor layer 8 contains an n-type impurity (typically phosphorus). The impurity concentration in the bottom semiconductor layer 8 decreases from its surface joining the buried oxide layer 3 toward its top surface. The thickness of the bottom semiconductor layer 8 is adjusted to approximately 0.5 µm or smaller. The bottom semiconductor layer 8 has seven sectional regions. The impurity concentration in the sectional regions varies. The impurity concentration in the sectional regions decreases from the one that is proximate to the n-type well semiconductor region 5 toward the one that is proximate to the p-type well semiconductor region 6. The impurity concentration in the sectional regions is set higher than the impurity concentration in the drift region 9 interposed between the surface semiconductor layer 7 and the bottom semiconductor layer 8. The impurity concentration in the sectional regions increases at integral multiples from the one proximate to the p-type well semiconductor region 6 to the one proximate to the n-type well semiconductor region 5. At the sectional region of the highest concentration, the value obtained by integrating the impurity concentration in the thickness direction is adjusted to approximately $1 \times 10^{12}$ to $5 \times 10^{12}$ cm$^{-2}$.

The drift region 9 is a region in which carriers flow. The drift region 9 is in the active layer 4, and has an intermediate region 91 which is interposed between the surface semiconductor layer 7 and the bottom semiconductor layer 8, a first side region 92 which is formed integrally with the intermediate region 91 and positioned closer to the p-type well semiconductor region 6 than the surface semiconductor layer 7 is, and a second side region 93 which is formed integrally with the intermediate region 91 and positioned closer to the n-type well semiconductor region 5 than the surface semiconductor layer 7 is. The first side region 92 has contact with the p-type well semiconductor region 6, and the second side region 93 has contact with the n-type well semiconductor region 5. The drift region 9 contains an n-type impurity (typically phosphorus) in a low concentration. The impurity concentration in the drift region 9, which is interposed between the surface semiconductor layer 7 and the bottom semiconductor layer 8, is set lower than the impurity concentration in the bottom semiconductor layer 8. The impurity concentration in the drift region 9 decreases from the bottom surface side toward the top surface side. The peak of the impurity concentration in the drift region 9 is located at about its interface with the buried oxide layer 3. The value obtained by integrating the impurity concentration in the drift region 9 in the thickness direction is adjusted to approximately $1 \times 10^{12}$ to $5 \times 10^{12}$ cm$^{-2}$. Accordingly, the amount of electric charge in the drift region 9 is substantially the same as the amount of electric charge in the surface semiconductor layer 7.

The semiconductor device 1 includes the gate dielectric layer 14 and the gate electrode 15. The gate electrode 15 faces via the gate dielectric layer 14 the p-type well semiconductor region 6 which isolates the source semiconductor region 10 from the drift region 9. The gate electrode 15 is electrically connected to the gate terminal S. The semiconductor device 1 further includes a field oxide layer 16. The field oxide layer 16 is formed in the surface of the active layer 4 in such a manner as to be interposed between the n-type well semiconductor region 5 and the p-type well semiconductor region 6. The field oxide layer 16 is formed thicker than the gate dielectric layer 14. On a part of the surface of the field oxide layer 16 that is on the side to the n-type well semiconductor region 5, there is formed a planer electrode 18. The planer electrode 18 is electrically connected to the drain terminal D.

As described above, parts of the surface semiconductor layer 7 and parts of the p-type well semiconductor region 6 are connected via a p-type semiconductor. According to the example shown in FIGS. 1 to 3, as viewed in the plan view (see FIG. 1), the surface semiconductor layer 7 partially extends along the gate dielectric layer 14 to the p-type well semiconductor region 6. More specifically, as shown in the plan view of FIG. 1, an end of the surface semiconductor layer 7 that is on the side to the p-type well semiconductor region 6 is formed with alternate projections and depressions. As shown in FIGS. 1 and 3, an end of the projection (projecting part) 71 has contact with the p-type well semiconductor region 6. As shown in FIGS. 1 and 2, a depression 72 is distanced from the p-type well semiconductor region 6.

With a structure having the above-described projections and depressions, when a predetermined gate voltage is applied to the gate electrode 15 to switch the semiconductor device 1 to the on state, no carrier flows between the source semiconductor region 10 and the drain semiconductor region 11 via the projections 71 (see FIGS. 1 and 3), whereas carriers flow therebetween via the depressions 72 (see FIGS. 1 and 2). The bold line arrow shown in FIG. 1 and the dashed line arrow in FIG. 2 indicate flows of carriers. The symbol "X" in FIG. 3 indicates no carrier flows.

More specifically, when a predetermined gate voltage is applied to the gate electrode 15, there is formed directly below the gate dielectric layer 14 an n-channel region 6a (a region directly below the gate dielectric layer 14 where the conductivity type is inverted from p-type to n-type). Since the depressions 72 have no contact with the p-type well semiconductor region 6, a current route is formed in the n-channel region 6a and the first side region 92 of the drift region 9, which are of the same conductivity type (n-type). Along the current route, current flows between the source semiconductor region 10 and the drain semiconductor region 11. That is, carriers present in the source semiconductor region 10 pass through the channel region 6a, the drift region 9 (the first side region 92, the intermediate region 91, and the second side region 93), the n-type well semiconductor region 5, and the drain semiconductor region 11.

Meanwhile, as shown in FIGS. 1 and 3, the projections 71 have contact with the p-type well semiconductor region 6, and the conductivity types of the channel region 6a and the surface semiconductor layer 7 are opposite to each other (n-type and p-type, respectively). Accordingly, the current route is interrupted at the contact area, and thus no current flows between the source semiconductor region 10 and the drain semiconductor region 11.

As described above, parts where current flows and parts where no current flows are formed alternately in the semiconductor device 1 in the width direction (Y direction as shown in FIG. 1), and consequently, a current amount per unit area of the semiconductor device 1 can be reduced. The reduction in current amount per unit area enables prevention of current crowding from occurring in the drain semiconductor region 11 as well as prevention of deterioration in forward breakdown voltage of the semiconductor device 1.

Further, as described in background art, in the case of conventional semiconductor devices, in order to set the surface semiconductor layer and the source semiconductor region to have the same electric potential, a contact semiconductor region needs to be formed in the surface semiconductor layer. On the other hand, according to the present embodiment, the contact semiconductor region is unnecessary, and thus the semiconductor device 1 can be downsized. More specifically, since the p-type well semiconductor region 6 and the surface semiconductor layer 7 have contact with each other by means of the projections 71, the source semiconductor region 10 and the surface semiconductor layer 7 have substantially the same electric potential, and thus the contact semiconductor region is unnecessary.

It should be noted that with the structure having projections and depressions, the dimension of the semiconductor device 1 in the width direction increases. However, if the semiconductor device 1 is formed in a ring shape or the like, such increase in dimension of the semiconductor device 1 in the width direction has a smaller impact (substantially no impact) on the size of the semiconductor device 1.

Second Embodiment

A second embodiment of the present invention will be described with reference to the drawings.

Figure 4:
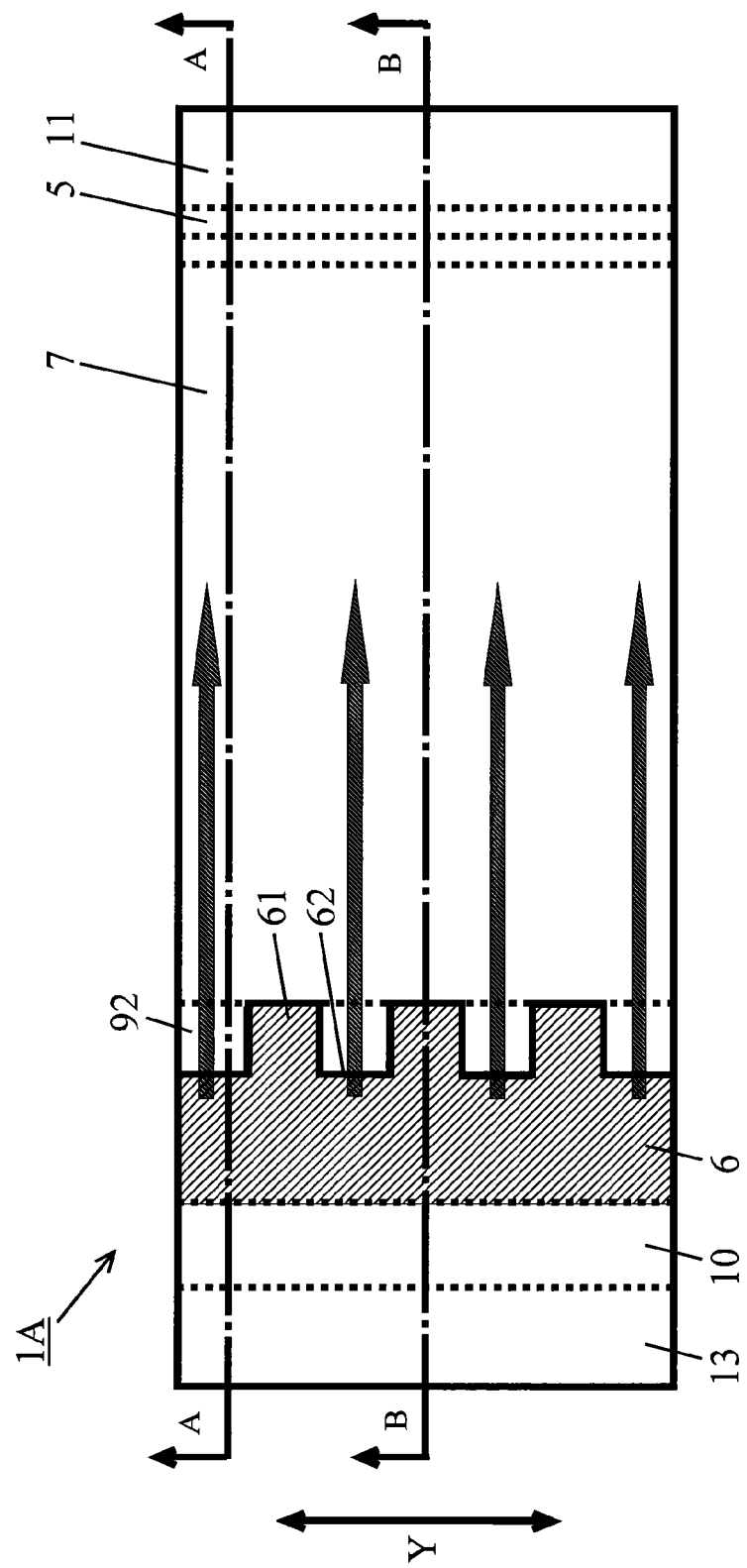
FIG. 4 is a plan view showing essential parts of a semiconductor device according to a second embodiment of the present invention.
Figure 5:
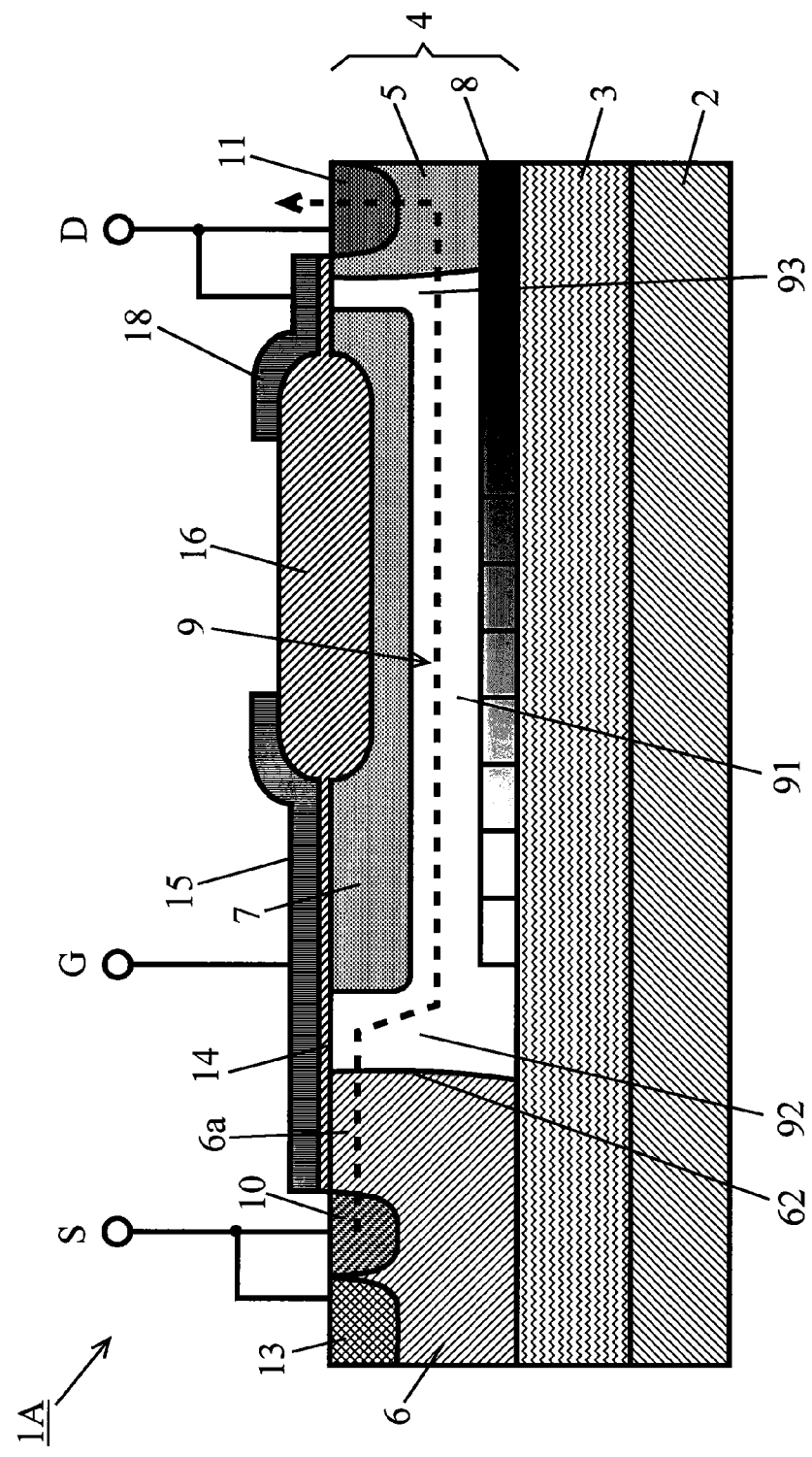
FIG. 5 is a cross-sectional view of the semiconductor device shown in FIG. 4 taken along line A-A.

FIG. 4 is a plan view showing essential parts of a semiconductor device according to a second embodiment of the present invention. FIG. 6 is a cross-sectional view of the semiconductor device shown in FIG. 4 taken along line A-A. FIG. 5 is a cross-sectional view of the semiconductor device shown in FIG. 4 taken along line B-B. It should be noted that no electrodes or field oxide layer are shown in FIG. 4. In the second embodiment, components that are identical to those in the first embodiment will be denoted by the corresponding identical reference characters, and no explanation will be given therefor.

In the second embodiment, an exemplary case will be described where the "first conductivity type" and the "second conductivity type" recited in the claims represent the n-type and the p-type, respectively.

In the above-described first embodiment, the surface semiconductor layer 7 partially extends along the gate dielectric layer 14 to the p-type well region 6. Meanwhile, in the case of a semiconductor device 1A according to the second embodiment, the p-type well region 6 partially extends along the gate dielectric layer 14 to the surface semiconductor layer 7.

More specifically, as shown in the plan view of FIG. 4, an end of the p-type well semiconductor region 6 that is on the side to the surface semiconductor layer 7 is formed with alternate projections and depressions. As shown in FIGS. 4 and 6, an end of the projection (projecting part) 61 has contact with the surface semiconductor layer 7. As shown in FIGS. 4 and 5, a depression 62 is distanced from the surface semiconductor layer 7. The bold line arrow shown in FIG. 4 and the dashed line arrow in FIG. 5 indicate flows of carriers. The symbol "X" shown in FIG. 6 indicates no carrier flows.

With a structure having the above-described projections and depressions, when a predetermined gate voltage is applied to the gate electrode 15 to switch the semiconductor device 1A to the on state, no carriers flow between the source semiconductor region 10 and the drain semiconductor region 11 via the projections 61 (see FIGS. 4 and 6), whereas carriers flow therebetween via the depressions 62 (see FIGS. 4 and 5).

More specifically, when a predetermined gate voltage is applied to the gate electrode 15, there is formed directly below the gate dielectric layer 14 the n-channel region 6a (the region directly below the gate dielectric layer 14 where the conductivity type is inverted from p-type to n-type). As shown in FIGS. 4 and 5, since the depressions 62 have no contact with the surface semiconductor layer 7, a current route is formed in the n-channel region 6a and the first side region 92 of the drift region 9, which are of the same conductivity type (n-type). Along the current route, current flows between the source semiconductor region 10 and the drain semiconductor region 11. That is, carriers present in the source semiconductor region 10 pass through the channel region 6a, the drift region 9 (the first side region 92, the intermediate region 91, and the second side region 93), the n-type well semiconductor region 5, and the drain semiconductor region 11.

Meanwhile, as shown in FIGS. 4 and 6, the projections 61 have contact with the surface semiconductor layer 7, and the conductivity types of the channel region 6a and the surface semiconductor layer 7 are opposite to each other (n-type and p-type, respectively). Accordingly, the current route is interrupted at the contact area, and thus no current flows between the source semiconductor region 10 and the drain semiconductor region 11.

As described above, parts where current flows and parts where no current flows are formed alternately in the semiconductor device 1A in the width direction (Y direction as shown in FIG. 4), and consequently, a current amount per unit area of the semiconductor device 1A can be reduced. The reduction in current amount per unit area enables prevention of current crowding from occurring in the drain semiconductor region 11 as well as prevention of deterioration in forward breakdown voltage of the semiconductor device 1A.

Further, as described in background art, in the case of conventional semiconductor devices, in order to set the surface semiconductor layer and the source semiconductor region to have the same electric potential, a contact semiconductor region needs to be formed in the surface semiconductor layer. On the other hand, according to the present embodiment, the contact semiconductor region is unnecessary, and thus the semiconductor device 1 can be downsized. More specifically, since the p-type well semiconductor region 6 and the surface semiconductor layer 7 have contact with each other by means of the projections 61, the source semiconductor region 10 and the surface semiconductor layer 7 have substantially the same electric potential, and thus the contact semiconductor region is unnecessary.

Third Embodiment

A third embodiment of the present invention will be described with reference to the drawings.

Figure 7:
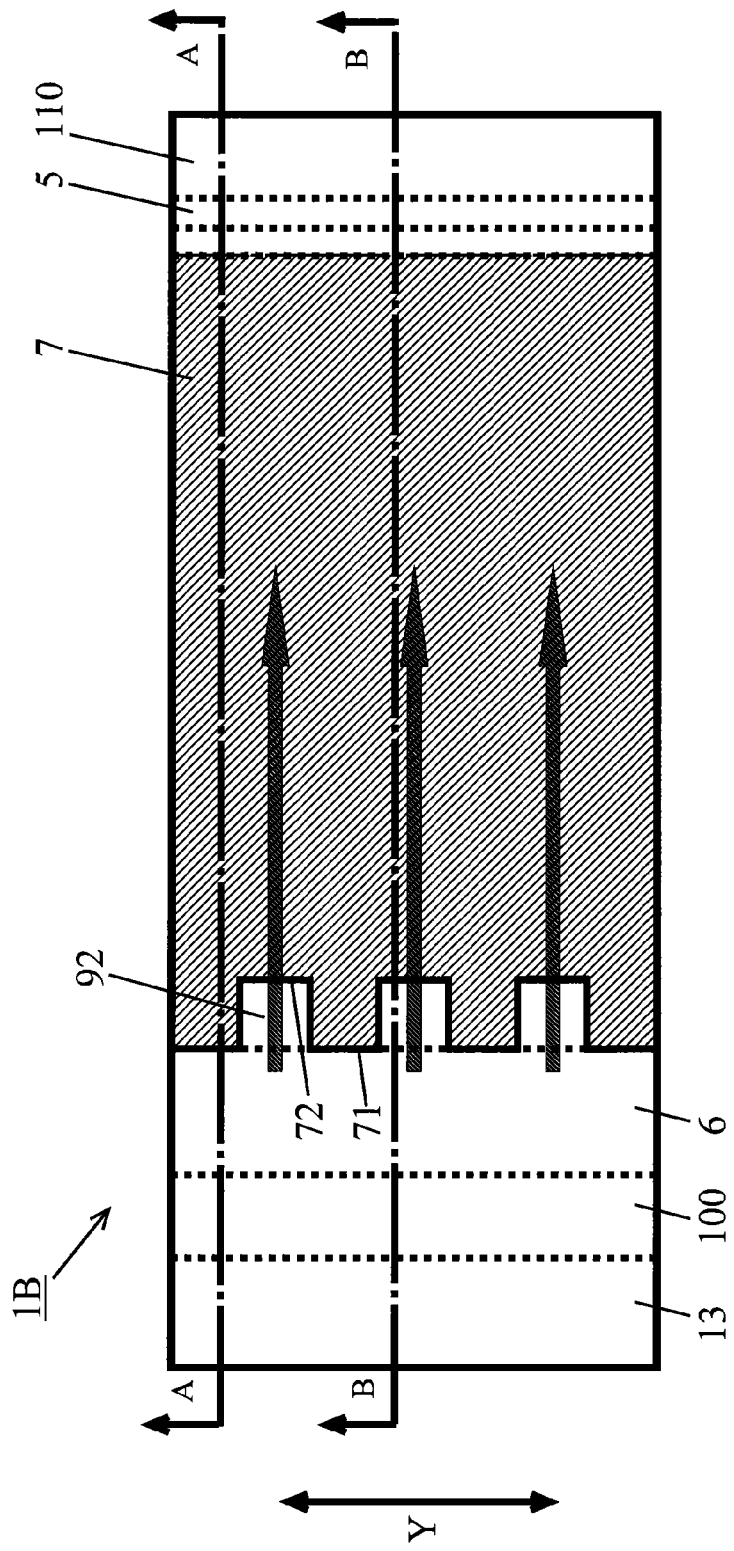
FIG. 7 is a plan view showing essential parts of a semiconductor device according to a third embodiment of the present invention.
Figure 8:
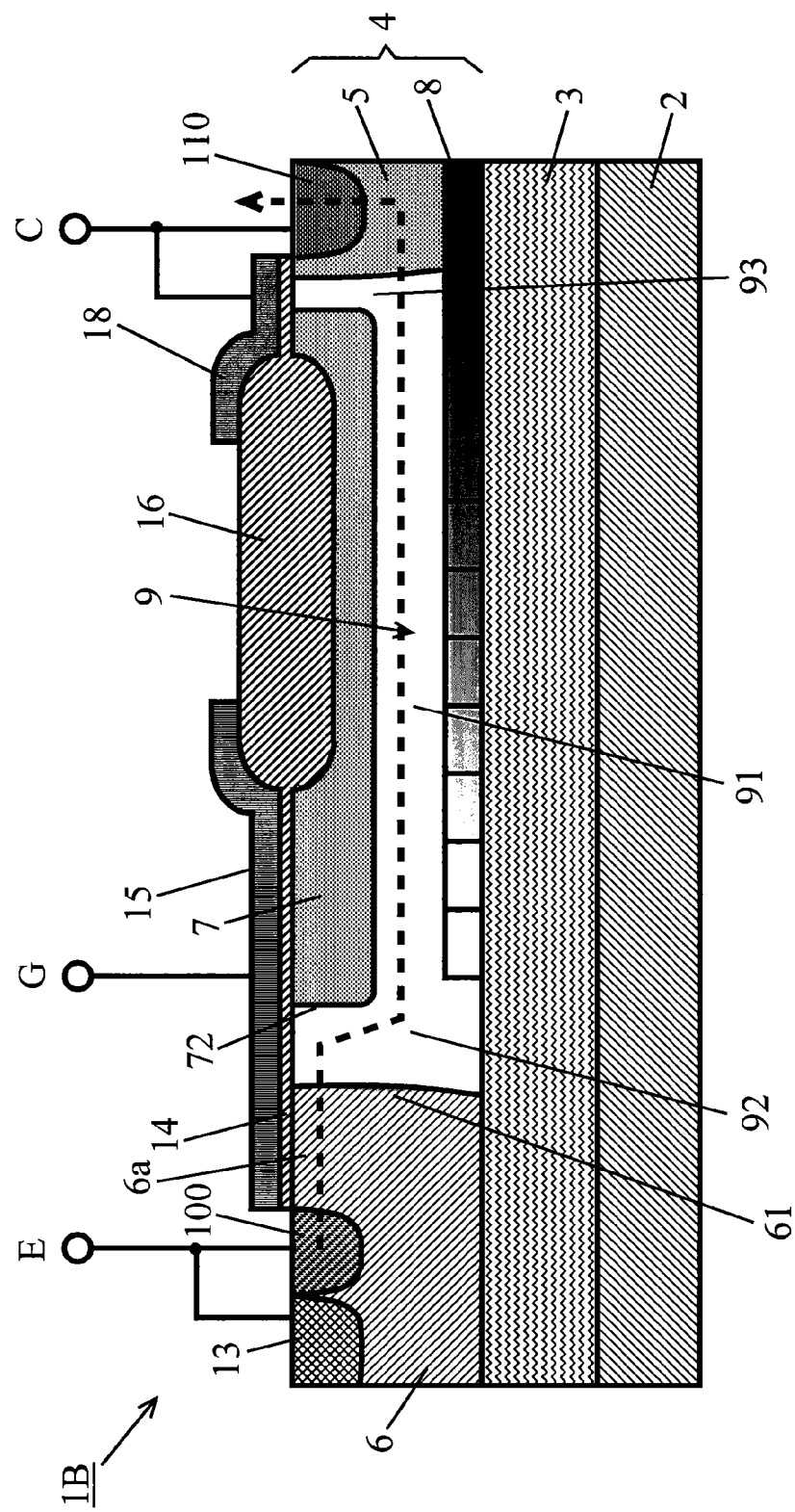
FIG. 8 is a cross-sectional view of the semiconductor device shown in FIG. 7 taken along line B-B.
Figure 9:
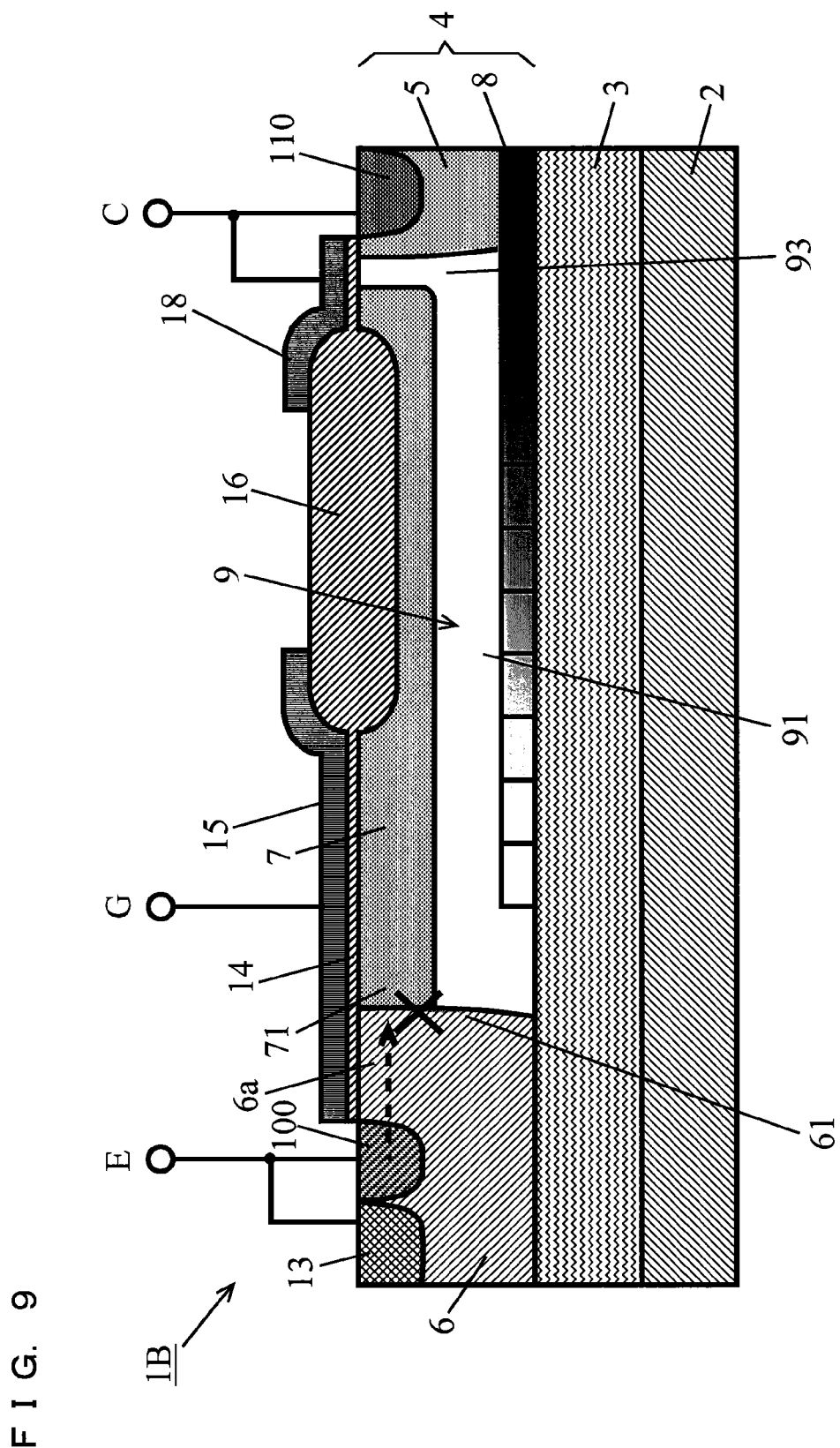
FIG. 9 is a cross-sectional view of the semiconductor device shown in FIG. 7 taken along line A-A.

FIG. 7 is a plan view showing essential parts of a semiconductor device according to a third embodiment of the present invention. FIG. 8 is a cross-sectional view of the semiconductor device shown in FIG. 7 taken along line B-B. FIG. 9 is a cross-sectional view of the semiconductor device shown in FIG. 7 taken along line A-A. It should be noted that no electrodes or field oxide layer are shown in FIG. 7. In the third embodiment, components that are identical to those in the first embodiment will be denoted by the corresponding identical reference characters, and no explanation will be given therefor.

In the third embodiment, an exemplary case will be described where the "first conductivity type" and the "second conductivity type" recited in the claims represent the n-type and the p-type, respectively.

The above-described first embodiment is an embodiment on the lateral n-type channel LDMOS, whereas the third embodiment is an embodiment on a lateral n-type channel LIGBT (lateral insulated gate bipolar transistor).

A semiconductor device 1B according to the third embodiment includes a collector semiconductor region 110 containing a p-type impurity (typically boron) in a high concentration, which corresponds to the drain semiconductor region 11 containing an n-type impurity in a high concentration according to the first embodiment. The collector semiconductor region 110 is electrically connected to a collector terminal C via a collector electrode (not shown). The region which functions as the source semiconductor region 10 in the first embodiment is replaced with an emitter semiconductor region 100 in the present embodiment. The emitter semiconductor region 100 is electrically connected to an emitter terminal E via an emitter electrode (not shown).

In the third embodiment, a structure having projections and depressions similar to that in the first embodiment is adopted. That is, parts of the surface semiconductor layer 7 and parts of the p-type well semiconductor region 6 are connected via a p-type semiconductor. According to the example shown in FIGS. 7 to 9, as shown in the plan view (see FIG. 7), the surface semiconductor layer 7 partially extends along the gate dielectric layer 14 to the p-type well semiconductor region 6. More specifically, as shown in the plan view of FIG. 7, an end of the surface semiconductor layer 7 that is on the side to the p-type well semiconductor region 6 is formed with alternate projections and depressions. As shown in FIGS. 7 and 9, an end of the projection (projecting part) 71 has contact with the p-type well semiconductor region 6. As shown in FIGS. 7 and 8, the depression 72 is distanced from the p-type well semiconductor region 6.

With the structure having the projections and depressions, when a predetermined gate voltage is applied to the gate electrode 15 to switch the semiconductor device 1B to the on state, no carrier flows between the emitter semiconductor region 100 and the collector semiconductor region 110 via the projections 71 (see FIGS. 7 and 9), whereas carriers flow therebetween via the depressions 72 (see FIGS. 7 and 8). The bold line arrow in FIG. 7 and the dashed line arrow in FIG. 8 indicate flows of carriers. The symbol "X" in FIG. 9 indicates no carrier flows.

More specifically, when a predetermined gate voltage is applied to the gate electrode 15, there is formed directly below the gate dielectric layer 14 the n-channel region 6a (the region directly below the gate dielectric layer 14 where the conductivity type is inverted from p-type to n-type). As shown in FIGS. 7 and 8, since the depressions 72 have no contact with the p-type well semiconductor region 6, a current route is formed in the n-channel region 6a and the first side region 92 of the drift region 9, which are of the same conductivity type (n-type). Along the current route, current flows between the emitter semiconductor region 100 and the collector semiconductor region 110. That is, carriers present in the emitter semiconductor region 100 pass through the channel region 6a, the drift region 9 (the first side region 92, the intermediate region 91, and the second side region 93), the n-type well semiconductor region 5, and the collector semiconductor region 110.

Meanwhile, as shown in FIGS. 7 and 9, the projections 71 have contact with the p-type well semiconductor region 6, and the conductivity types of the channel region 6a and the surface semiconductor layer 7 are opposite to each other (n-type and p-type, respectively). Accordingly, the current route is interrupted at the contact area, and thus no current flows between the emitter semiconductor region 100 and the collector semiconductor region 110.

As described above, parts where current flows and parts where no current flows are formed alternately in the semiconductor device 1B in the width direction (Y direction as shown in FIG. 7), and consequently, a current amount per unit area of the semiconductor device 1B can be reduced. The reduction in current amount per unit area enables prevention of current crowding from occurring in the collector semiconductor region 110 as well as prevention of deterioration in forward breakdown voltage of the semiconductor device 1B.

Further, as described in background art, in the case of conventional semiconductor devices, in order to set the surface semiconductor layer and the source semiconductor region to have the same electric potential, a contact semiconductor region needs to be formed in the surface semiconductor layer. On the other hand, according to the present embodiment, the contact semiconductor region is unnecessary, and thus the semiconductor device 1B can be downsized. More specifically, since the p-type well semiconductor region 6 and the surface semiconductor layer 7 have contact with each other by means of the projections 71, the source semiconductor region 10 and the surface semiconductor layer 7 have substantially the same electric potential, and thus the contact semiconductor region is unnecessary.

It should be noted that with the structure having projections and depressions, the dimension of the semiconductor device 1B in the width direction increases. However, if the semiconductor device 1B is formed in a ring shape or the like, such increase in dimension of the semiconductor device 1B in the width direction has a smaller impact (substantially no impact) on the size of the semiconductor device 1B.

Fourth Embodiment

A fourth embodiment of the present invention will be described with reference to the drawings.

Figure 10:
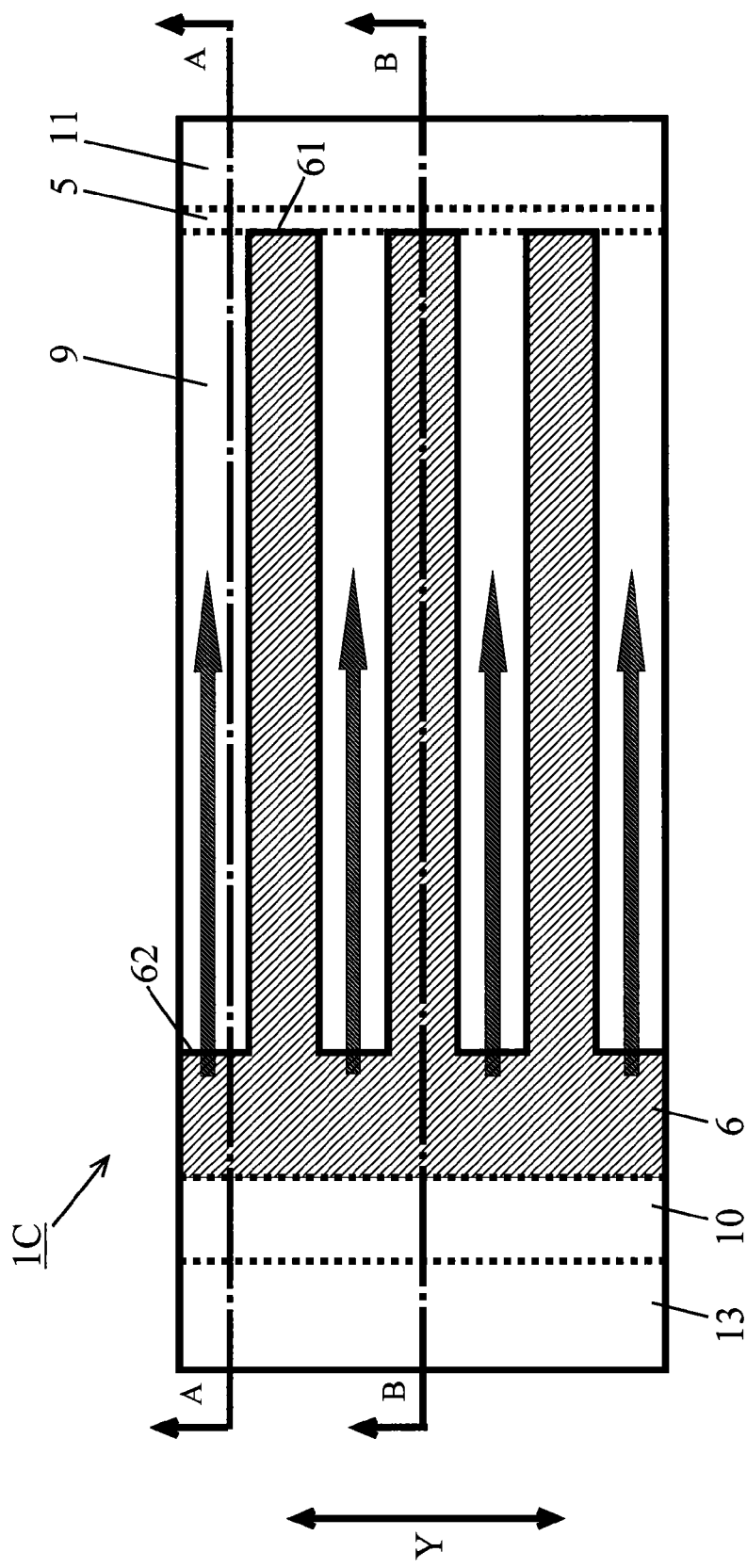
FIG. 10 is a plan view showing essential parts of a semiconductor device according to a fourth embodiment of the present invention.
Figure 11:
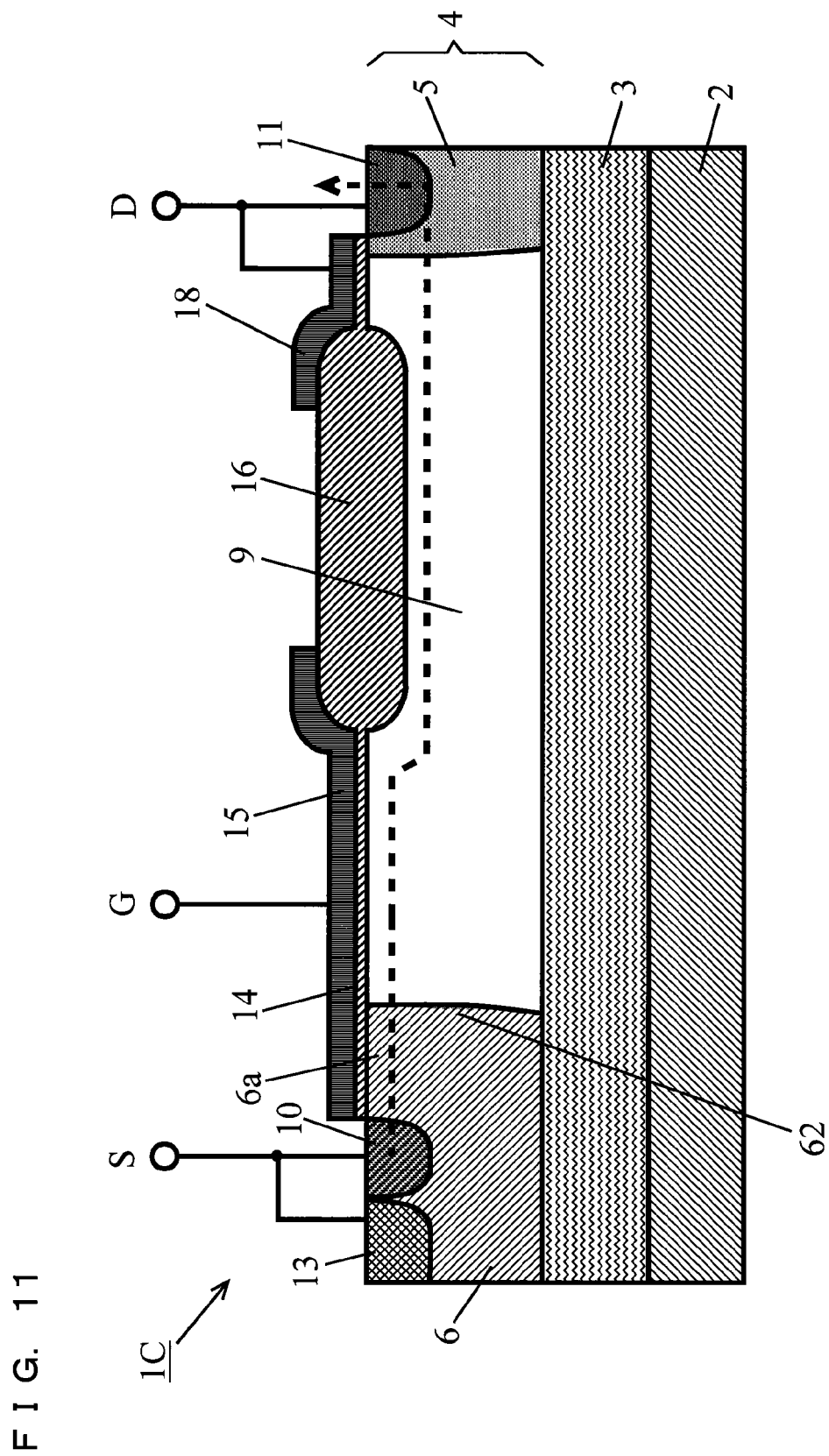
FIG. 11 is a cross-sectional view of the semiconductor device shown in FIG. 10 taken along line A-A.
Figure 12:
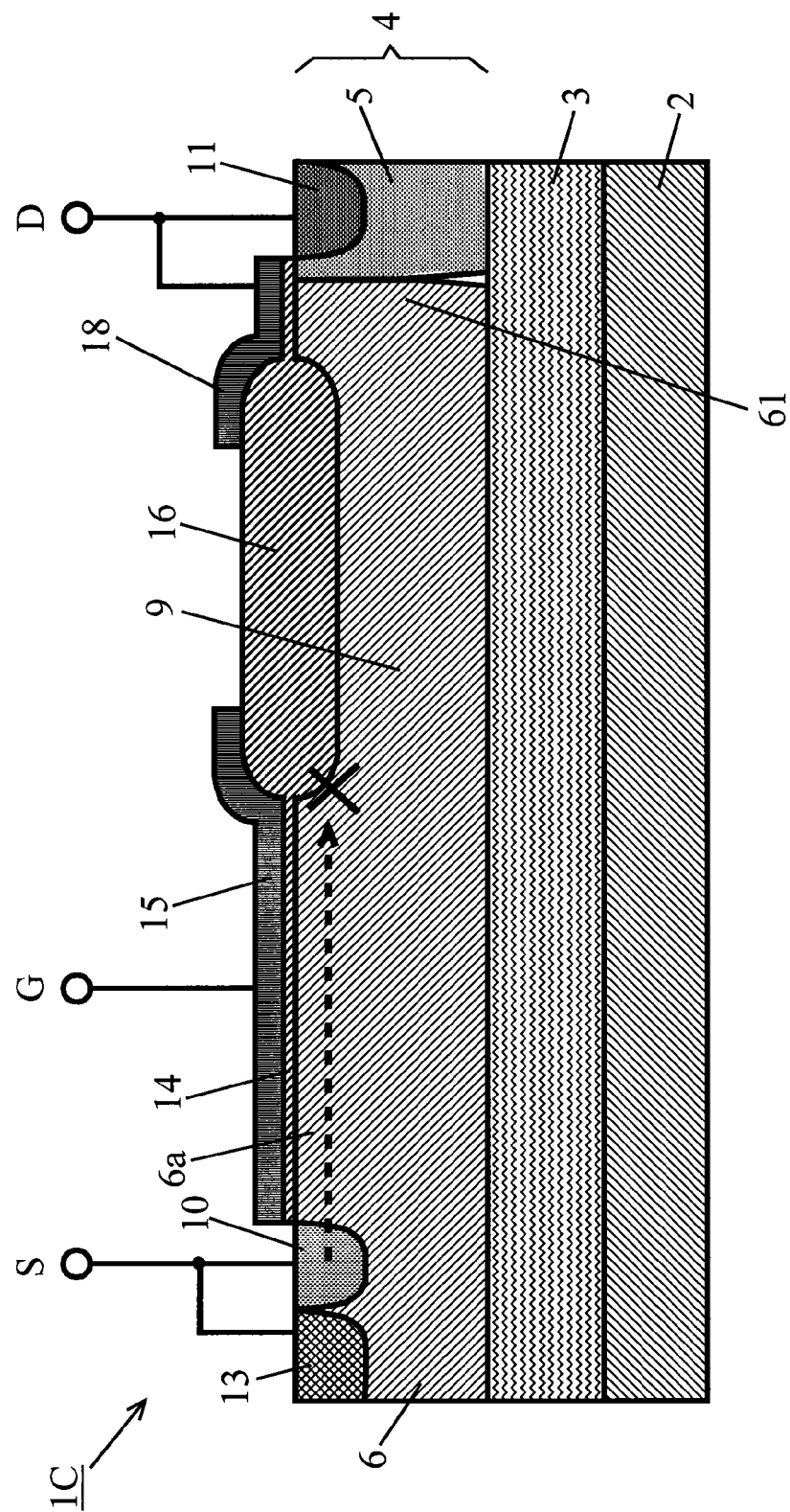
FIG. 12 is a cross-sectional view of the semiconductor device shown in FIG. 10 taken along line B-B.

FIG. 10 is a plan view showing essential parts of a semiconductor device according to a fourth embodiment of the present invention. FIG. 11 is a cross-sectional view of the semiconductor device shown in FIG. 10 taken along line A-A. FIG. 12 is a cross-sectional view of the semiconductor device shown in FIG. 10 taken along line B-B. It should be noted that no electrodes or field oxide layer are shown in FIG. 10. In the fourth embodiment, components that are identical to those in the first embodiment will be denoted by the corresponding identical reference characters, and no explanation will be given therefor.

In the fourth embodiment, an exemplary case will be described where the "first conductivity type" and the "second conductivity type" recited in the claims represent the n-type and the p-type, respectively.

A semiconductor device IC according to the fourth embodiment does not include the surface semiconductor layer 7 or the bottom semiconductor layer 8 which are included in the device according to the first embodiment. In the third fourth embodiment, the following structure is adopted.

Since the device according to the fourth embodiment does not include the surface semiconductor layer 7 and the bottom semiconductor layer 8, the drift region 9 is not divided into the intermediate region, the first side region, or the second side region unlike the first embodiment. The drift region 9 has contact with the p-type well semiconductor region 6 at its one end and with the n-type well semiconductor region 5 at the other end.

The p-type well semiconductor region 6 partially extends along the gate dielectric layer 14 in the n-type drift region 9. Specifically, the p-type well semiconductor region 6 partially extends, in the drift region 9, longer than the length of the gate dielectric layer 14 in a direction in which carriers move (i.e., to the position beyond the part directly below the boundary between the gate dielectric layer 14 and the field oxide layer 16).

More specifically, as shown in the plan view of FIG. 10, an end of the p-type well semiconductor region 6 that is on the side to the n-type well semiconductor region 5 is formed with alternate projections and depressions. As shown in FIGS. 10 and 12, an end of the projection (projecting part) 61 has contact with the n-type well semiconductor region 5. As shown in FIGS. 10 and 11, the depression 62 is distanced from the n-type well semiconductor region 5, and does not reach the position directly below the boundary between the gate dielectric layer 14 and the field oxide layer 16.

With a structure having the above-described projections and depressions, when a predetermined gate voltage is applied to the gate electrode 15 to switch the semiconductor device 1C to the on state, no carriers flow between the source semiconductor region 10 and the drain semiconductor region 11 via the projections 61 (see FIGS. 10 and 12), whereas carriers flow therebetween via the depressions 62 (see FIGS. 10 and 11). The bold line arrow in FIG. 10 and the dashed line arrow in FIG. 11 indicate flows of carriers. The symbol "X" in FIG. 12 indicates no carrier flows.

More specifically, when a predetermined gate voltage is applied to the gate electrode 15, there is formed directly below the gate dielectric layer 14 the n-channel region 6a (the region directly below the gate dielectric layer 14 where the conductivity type is inverted from p-type to n-type). As shown in FIGS. 10 and 11, since the depressions 62 are shorter in the direction in which carriers move than the gate dielectric layer 14 (i.e., not extending beyond the gate dielectric layer 14), a current route is formed in the n-channel region 6a and the drift region 9, which are of the same conductivity type (n-type). Along the current route, current flows between the source semiconductor region 10 and the drain semiconductor region 11. That is, carriers present in the source semiconductor region 10 pass through the channel region 6a, the drift region 9, the n-type well semiconductor region 5, and the drain semiconductor region 11.

Meanwhile, as shown in FIGS. 10 and 12, the projections 61 extend longer than the length of the gate dielectric layer 14 in the direction in which carriers move (i.e., to the position beyond the gate dielectric layer 14 (the position reaching the n-type well semiconductor region 5 in FIG. 12)). Accordingly, the current route is interrupted in the projections 61 at the part directly below the boundary between the gate dielectric layer 14 and the field oxide layer 16, and thus no current flows between the source semiconductor region 10 and the drain semiconductor region 11.

As described above, parts where current flows and parts where no current flows are formed alternately in the semiconductor device 1C in the width direction (Y direction as shown in FIG. 10), and consequently, a current amount per unit area of the semiconductor device 1C can be reduced. The reduction in current amount per unit area enables prevention of current crowding from occurring in the drain semiconductor region 11 as well as prevention of deterioration in forward breakdown voltage of the semiconductor device 1C.

Further, as described in background art, in the case of conventional semiconductor devices, in order to set the surface semiconductor layer and the source semiconductor region to have the same electric potential, a contact semiconductor region needs to be formed in the surface semiconductor layer. On the other hand, according to the present embodiment, because of no surface semiconductor layer, the contact semiconductor region is unnecessary, and thus the semiconductor device 1C can be downsized.

It should be noted that the above-described fourth embodiment may have a structure in which the n-type and the p-type are reversed.

Fifth Embodiment

A fifth embodiment of the present invention will be described with reference to the drawings.

Figure 13:
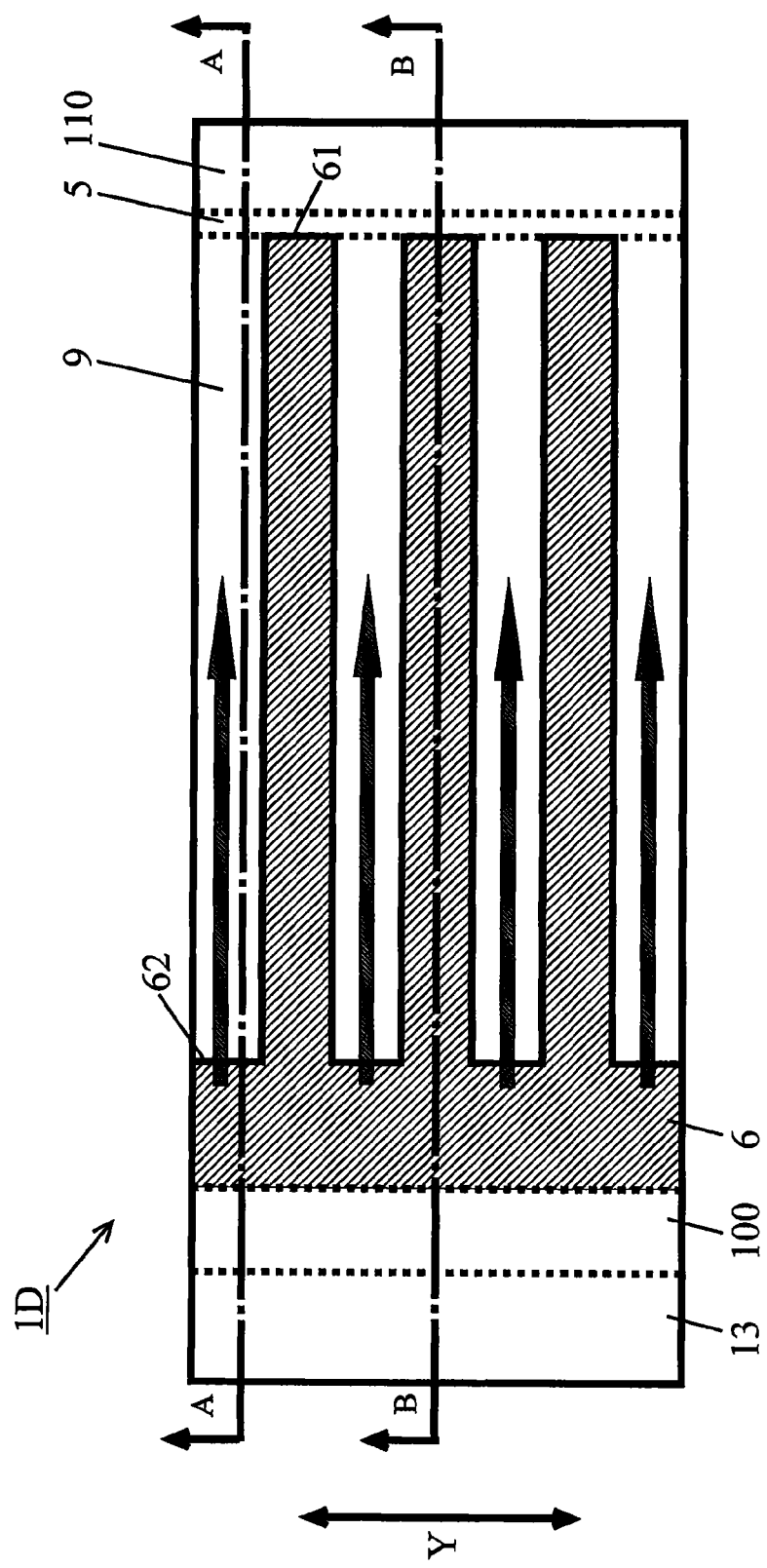
FIG. 13 is a plan view showing essential parts of a semiconductor device according to a fifth embodiment of the present invention.
Figure 15:
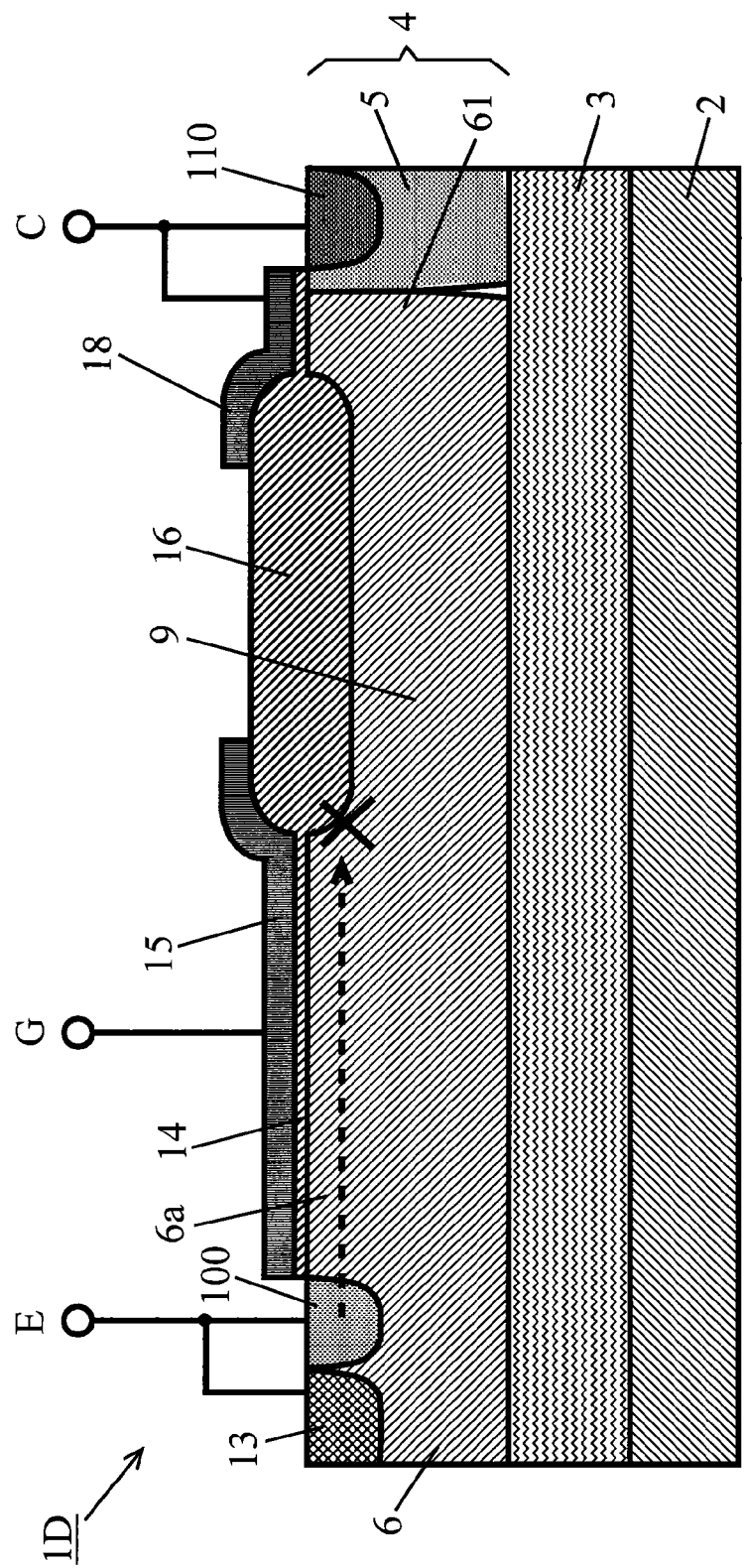
FIG. 15 is a cross-sectional view of the semiconductor device shown in FIG. 13 taken along line B-B.

FIG. 13 is a plan view showing essential parts of a semiconductor device according to a fifth embodiment of the present invention. FIG. 14 is a cross-sectional view of the semiconductor device shown in FIG. 13 taken along line A-A. FIG. 15 is a cross-sectional view of the semiconductor device shown in FIG. 13 taken along line B-B. It should be noted that no electrodes or field oxide layer are shown in FIG. 13. In the fifth embodiment, components that are identical to those in the fourth embodiment will be denoted by the corresponding identical reference characters, and no explanation will be given therefor.

In the fifth embodiment, an exemplary case will be described where the "first conductivity type" and the "second conductivity type" recited in the claims represent the n-type and the p-type, respectively.

The above-described fourth embodiment is an embodiment on the lateral n-type channel LDMOS, whereas the fifth embodiment is an embodiment on a lateral n-type channel LIGBT (lateral insulated gate bipolar transistor).

A semiconductor device 1D according to the fifth embodiment includes a collector semiconductor region 110 containing a p-type impurity (typically boron) in a high concentration, which corresponds to the drain semiconductor region 11 containing an n-type impurity in a high concentration according to the fourth embodiment. The collector semiconductor region 110 is electrically connected to a collector terminal C via the collector electrode (not shown). The region which functions as the source semiconductor region 10 in the fourth embodiment is replaced with an emitter semiconductor region 100 in the fifth embodiment. The emitter semiconductor region 100 is electrically connected to the emitter terminal E via an emitter electrode (not shown).

In the fifth embodiment, the structure having projections and depressions similar to that in the fourth embodiment is adopted.

More specifically, as shown in the plan view of FIG. 13, an end of the p-type well semiconductor region 6 that is on the side to the n-type well semiconductor region 5 is formed with alternate projections and depressions. As shown in FIGS. 13 and 15, an end of the projection (projecting part) 61 has contact with the n-type well semiconductor region 5. As shown in FIGS. 13 and 14, the depression 62 is distanced from the n-type well semiconductor region 5, and does not reach the part directly below the boundary between the gate dielectric layer 14 and the field oxide layer 16.

Accordingly, as in the fourth embodiment, parts where current flows and parts where no current flows are formed alternately in the semiconductor device 1D in the width direction (Y direction as shown in FIG. 13), and consequently, a current amount per unit area of the semiconductor device 1D can be reduced. The reduction in current amount per unit area enables prevention of current crowding from occurring in the collector semiconductor region 110 as well as prevention of deterioration in forward breakdown voltage of the semiconductor device 1D.

Further, in the present embodiment, since a contact semiconductor region is unnecessary, the semiconductor device 1D can be downsized.

Sixth Embodiment

A sixth embodiment of the present invention will be described with reference to the drawings.

Figure 16:
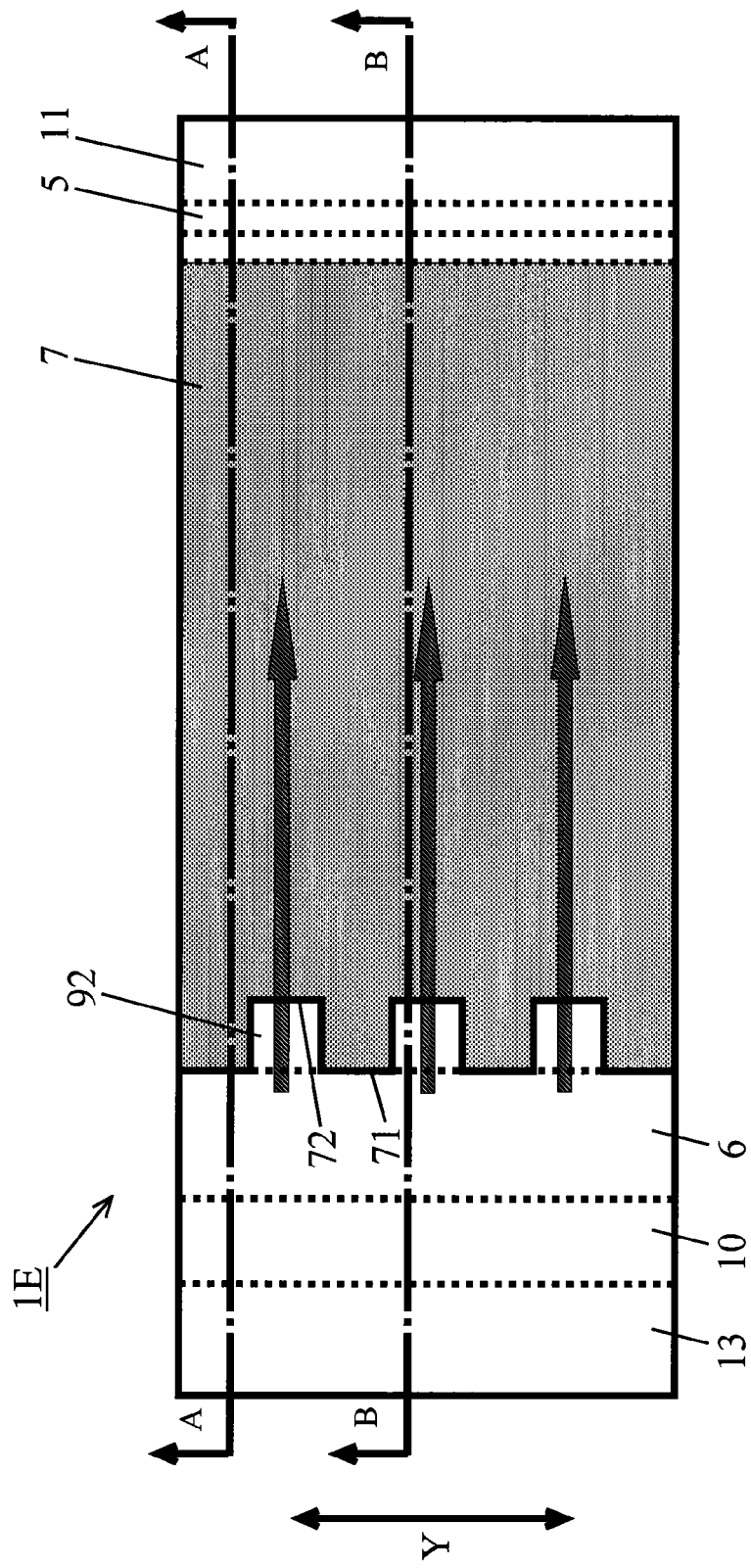
FIG. 16 is a plan view showing essential parts of a semiconductor device according to a sixth embodiment of the present invention.
Figure 18:
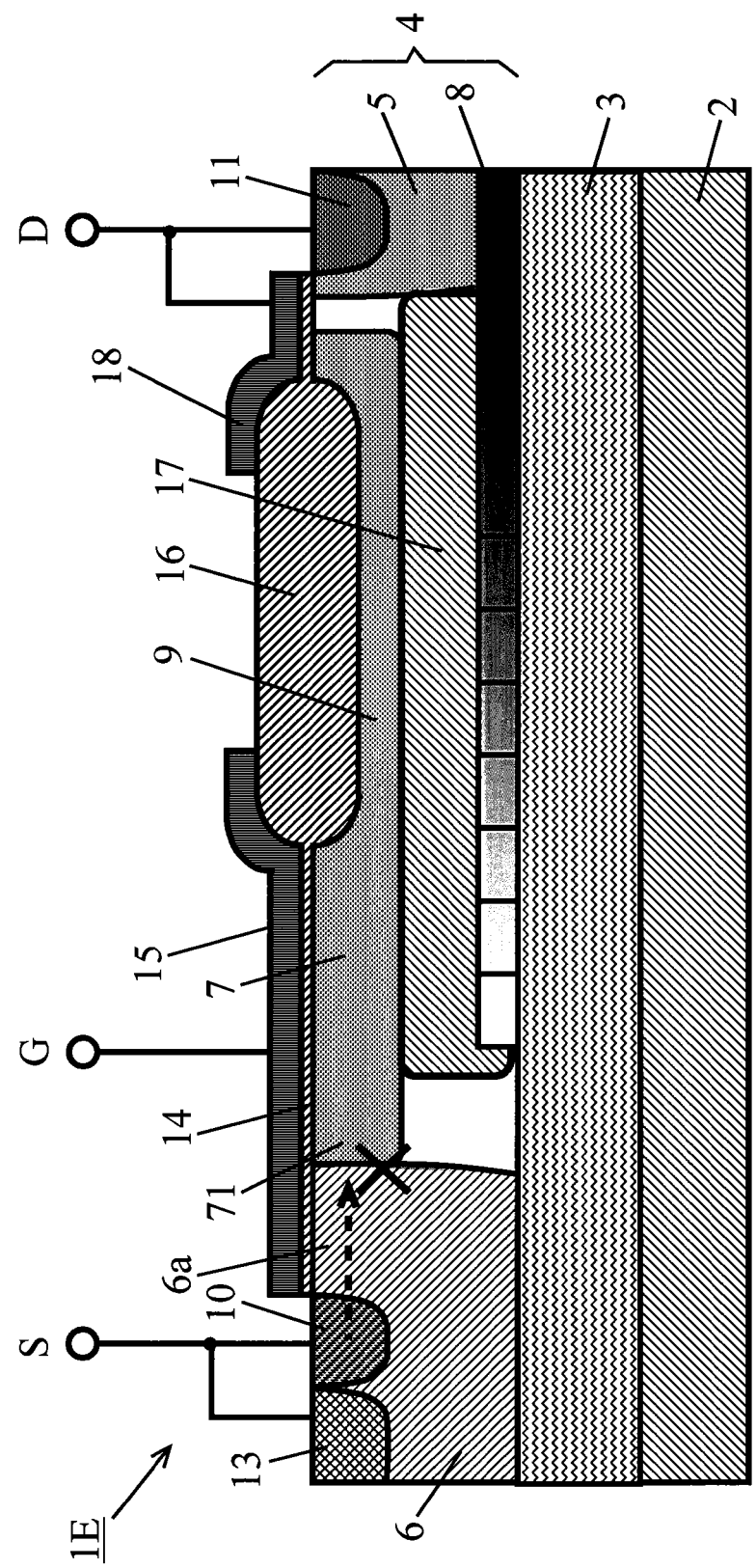
FIG. 18 is a cross-sectional view of the semiconductor device shown in FIG. 16 taken along line A-A.

FIG. 16 is a plan view showing essential parts of a semiconductor device according to a sixth embodiment of the present invention. FIG. 17 is a cross-sectional view of the semiconductor device shown in FIG. 16 taken along line B-B. FIG. 18 is a cross-sectional view of the semiconductor device shown in FIG. 16 taken along line A-A. It should be noted that no electrodes or field oxide layer are shown in FIG. 16. In the sixth embodiment, components that are identical to those in the first embodiment will be denoted by the corresponding identical reference characters, and no explanation will be given therefor.

In the sixth embodiment, an exemplary case will be described where the "first conductivity type" and the "second conductivity type" recited in the claims represent the n-type and the p-type, respectively.

A semiconductor device 1E according to the sixth embodiment is different from that according to the first embodiment in that a bottom semiconductor layer 17 is formed between the surface semiconductor layer 7 and the bottom semiconductor layer 8.

Specifically, as shown in FIGS. 17 and 18, the semiconductor active layer 4 includes the bottom semiconductor layer 17 instead of the intermediate region 91 of the drift region 9 according to the first embodiment. The bottom semiconductor layer 17 has contact at its one end with the n-type well semiconductor region 5. The bottom semiconductor layer 17 contains an n-type impurity (typically phosphorus). The impurity concentration is higher than the impurity concentration in the intermediate region 91 of the drift region 9 according to the first embodiment. With this structure, it is possible to reduce the on-resistance of the semiconductor device 1E.

Seventh Embodiment

A seventh embodiment of the present invention will be described with reference to the drawings.

Figure 19:
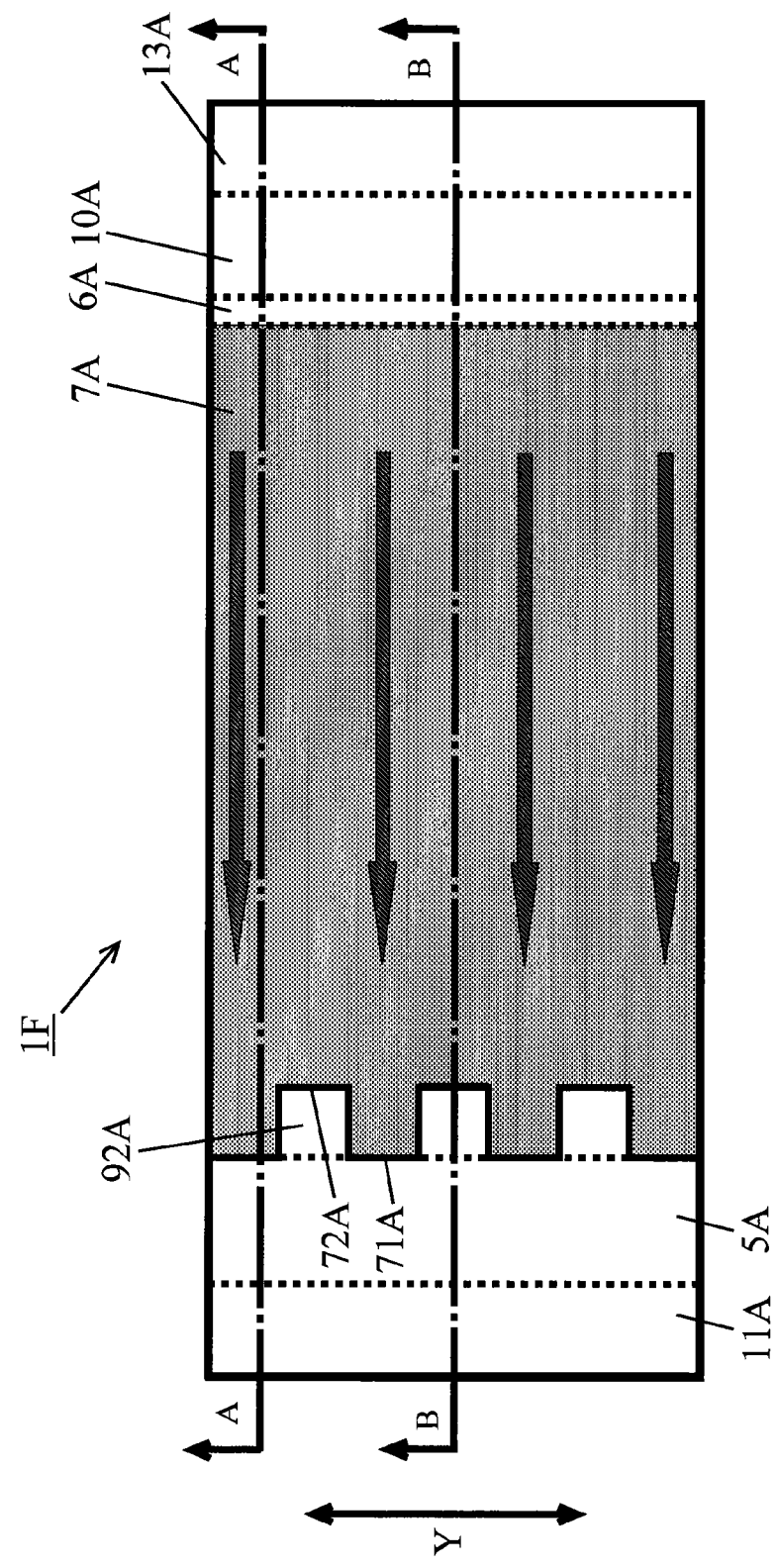
FIG. 19 is a plan view showing essential parts of a semiconductor device according to a seventh embodiment of the present invention.
Figure 20:
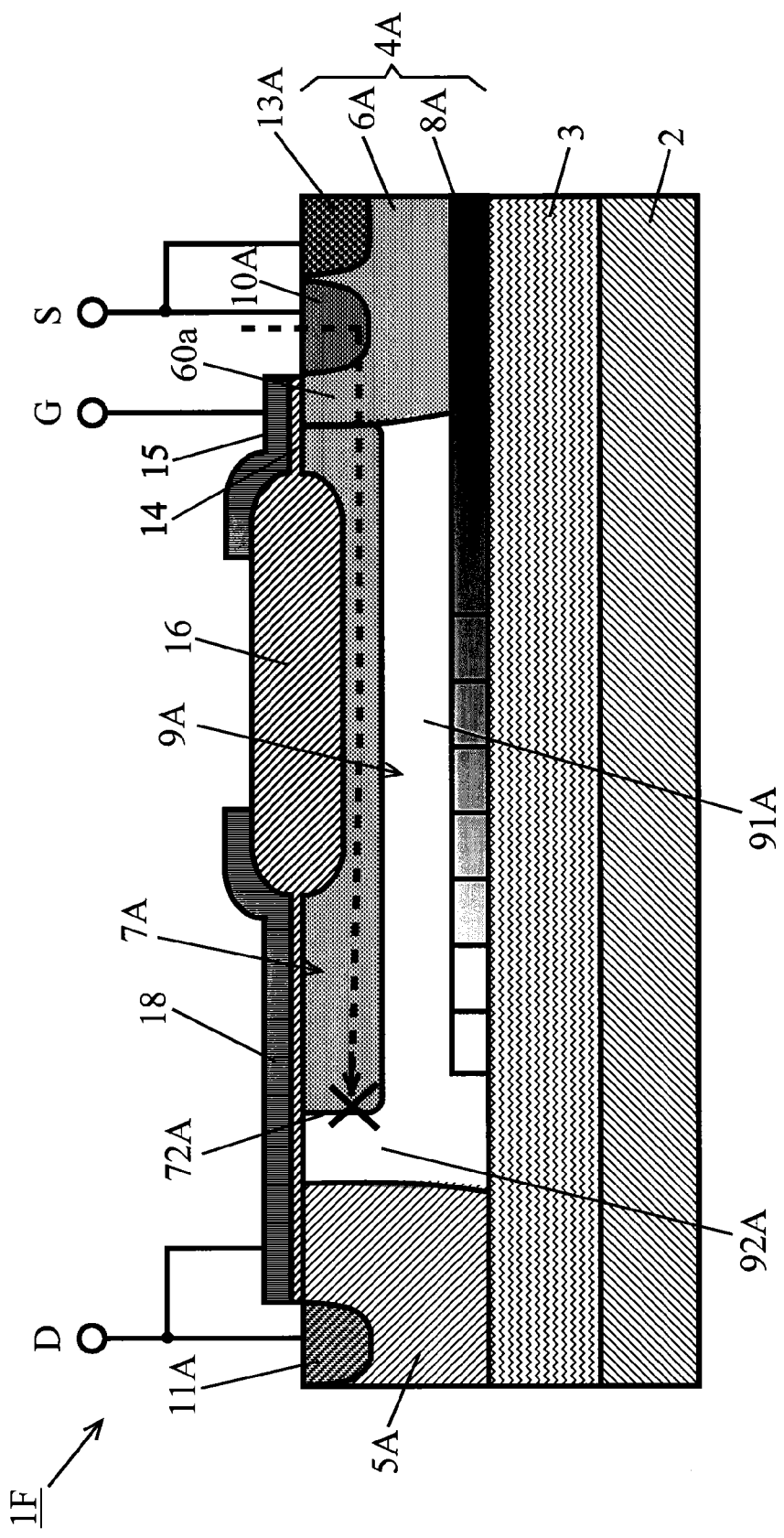
FIG. 20 is a cross-sectional view of the semiconductor device shown in FIG. 19 taken along line B-B.

FIG. 19 is a plan view showing essential parts of a semiconductor device according to a seventh embodiment of the present invention. FIG. 20 is a cross-sectional view of the semiconductor device shown in FIG. 19 taken along line B-B. FIG. 21 is a cross-sectional view of the semiconductor device shown in FIG. 19 taken along line A-A. It should be noted that no electrodes or field oxide layer are shown in FIG. 19. In the seventh embodiment, components that are identical to those in the first embodiment will be denoted by the corresponding identical reference characters, and no explanation will be given therefor.

In the seventh embodiment, an exemplary case will be described where the "first conductivity type" and the "second conductivity type" recited in the claims represent the n-type and the p-type, respectively.

The above-described first embodiment is an embodiment on the lateral n-type channel LDMOS, whereas the seventh embodiment will be an embodiment on a p-type channel LDMOS.

Firstly, an outline of a semiconductor device 1F according to the seventh embodiment will be described.

The semiconductor device 1F includes the semiconductor substrate 2 made of a single crystal silicon containing a second conductivity type (p-type) impurity in a high concentration, the buried oxide layer 3 made of silicon oxide ($SiO_2$) formed on the semiconductor substrate 2, and the active layer 4A made of a single crystal silicon formed on the buried oxide layer 3.

The structure of the active layer 4 is such that a well semiconductor region 6A which is of first conductivity type (n-type) and surrounds a source semiconductor region 10A of second conductivity type (p-type) and a well semiconductor region 5A which is of second conductivity type (p-type) and surrounds a drain semiconductor region 11A of second conductivity type (p-type) are arranged in such a manner as to sandwich a drift region 9A of first conductivity type (n-type).

On a part of the surface of the active layer 4A, the gate electrode 15 is formed via the gate dielectric layer 14 which has contact with the surface of the well semiconductor region 6A of first conductivity type and with the surface of the region 9A of first conductivity type. In the surface part of the active layer 4A, there is formed a surface semiconductor layer 7A of second conductivity type (p-type) which has contact with the gate dielectric layer 14. The surface semiconductor layer 7A corresponds to the "second conductivity type surface layer" recited in the claims.

Parts of the surface semiconductor layer 7A and parts of the well semiconductor region 5A of second conductivity type (p-type) are connected with one another.

Hereinafter, the semiconductor device 1F will be described in detail.

The semiconductor substrate 2 may contain the p-type impurity in a high concentration, or may contain an n-type impurity (typically phosphorus) in a high concentration. The semiconductor substrate 2 can substantially be evaluated as a conductive material. In order to maintain the mechanical strength (against warpage or the like) of wafers, the resistivity of the semiconductor substrate 2 is preferably set as low as about 1 to 100 Ω·cm. The thickness of the buried oxide layer 3 is, for example, set to 3 to 5 μm The active layer 4A has the p-type well semiconductor region 5A, the n-type well semiconductor region 6A, the surface semiconductor layer 7A, a bottom semiconductor layer 8A, the region 9A, and the source semiconductor region 10A. The thickness of the active layer 4A is, for example, set to about 2.0 to 2.5 μm. With the thickness of 2.0 μm or greater, the ESD withstand capability is less likely to deteriorate. In the present embodiment, for example, a known RESURF structure of which application has previously been filed by the applicant of the present invention may be applied (see Japanese laid-open application publication No. 2007-173422).

The p-type well semiconductor region 5A is formed as a part of the active layer 4A, and contains a p-type impurity (typically boron). The impurity concentration in the p-type well semiconductor region 5A is adjusted to approximately $5 \times 10^{16}$ to $5 \times 10^{17}$ $cm^{-3}$. The p-type well semiconductor region 5A includes in its surface part the drain semiconductor region 11A which contains a p-type impurity (typically boron) in a high concentration. The drain semiconductor region 11A can be evaluated as a part of the p-type well semiconductor region 5A. The impurity concentration in the drain semiconductor region 11A is adjusted to approximately $1 \times 10^{19}$ to $1 \times 10^{22}$ $cm^{-3}$. The p-type well semiconductor region 5A is electrically connected to the drain terminal D via the drain semiconductor region 11A and the drain electrode (not shown). The p-type well semiconductor region 5A extends from the top surface to the bottom surface of the active layer 4A. The semiconductor device 1F has an overlapped region where a part of the p-type well semiconductor region 5A and a part of the bottom semiconductor layer 8A overlap each other.

The n-type well semiconductor region 6A is formed as a part of the active layer 4A, and is isolated from the p-type well semiconductor region 5A by the region 9A. The n-type well semiconductor region 6A contains an n-type impurity (typically phosphorus). The impurity concentration in the n-type well semiconductor region 6A is adjusted to approximately $5 \times 10^{16}$ to $5 \times 10^{17}$ $cm^{-3}$. The n-type well semiconductor region 6A includes in its surface part a well-contacting semiconductor region 13A which contains an n-type impurity (typically phosphorus) in a high concentration. The impurity concentration in the well-contacting semiconductor region 13A is adjusted to approximately $1 \times 10^{19}$ to $1 \times 10^{22}$ $cm^{-3}$. The well-contacting semiconductor region 13A can be evaluated as a part of the n-type well semiconductor region 6A. The n-type well semiconductor region 6A is electrically connected to the source terminal S via the well-contacting semiconductor region 13A and the source electrode (not shown). The n-type well semiconductor region 6A extends from the top surface to the bottom surface of the active layer 4A. The n-type well semiconductor region 6A has contact with the buried oxide layer 3.

The source semiconductor region 10A is formed in the surface part of the n-type well semiconductor region 6A, and is isolated from the region 9A by the n-type well semiconductor region 6. The source semiconductor region 10A contains a p-type impurity (typically boron) in a high concentration. The source semiconductor region 10A is electrically connected to the source terminal S via the source electrode (not shown).

The surface semiconductor layer 7A is formed in the surface part of the active layer 4A, and is interposed between the p-type well semiconductor region 5A and the n-type well semiconductor region 6A. The surface semiconductor layer 7A contains a p-type impurity (typically boron). The value obtained by integrating the impurity concentrations in the surface semiconductor layer 7A in its thickness direction is adjusted to approximately $1 \times 10^{12}$ to $5 \times 10^{12}$ $cm^{-2}$. An end of the surface semiconductor layer 7A has contact with the n-type well semiconductor region 6A.

The bottom semiconductor layer 8A is formed in the bottom part of the active layer 4A, interposed between the p-type well semiconductor region 5A and the n-type well semiconductor region 6A, and isolated from the surface semiconductor layer 7A by the region 9A. The bottom semiconductor layer 8A has contact with the n-type well semiconductor region 6A and is distanced from the n-type well semiconductor region 5A. The bottom semiconductor layer 8A contains an n-type impurity (typically phosphorus). The impurity concentration in the bottom semiconductor layer 8A decreases from its surface joining the buried oxide layer 3 toward its top surface. The thickness of the bottom semiconductor layer 8A is adjusted to approximately 0.5 μm or smaller. The bottom semiconductor layer 8A has seven sectional regions. The impurity concentration in the sectional regions varies. The impurity concentration in the sectional regions decreases from the one that is proximate to the n-type well semiconductor region 6A toward the one that is proximate to the p-type well semiconductor region 5A. The impurity concentration in the sectional regions is set higher than the impurity concentration in the region 9A interposed between the surface semiconductor layer 7A and the bottom semiconductor layer 8A. The impurity concentration in the sectional regions increases at integral multiples from the one proximate to the p-type well semiconductor region 5A to the one proximate to the n-type well semiconductor region 6A. At the sectional region of the highest concentration, the value obtained by integrating the impurity concentration in the thickness direction is adjusted to approximately $1\times10^{12}$ to $5\times10^{12}$ cm$^{-2}$.

The region 9A is in the active layer 4A, and has a main area 91A which is interposed between the surface semiconductor layer 7A and the bottom semiconductor layer 8A, and a first side region 92A which is formed integrally with the main area 91A and positioned closer to the p-type well semiconductor region 5A than the surface semiconductor layer 7A is. The main area 91A has contact with the n-type well semiconductor region 6A, and the first side region 92A has contact with the p-type well semiconductor region 5A. The region 9A contains an n-type impurity (typically phosphorus) in a low concentration. The impurity concentration in the region 9A, which is interposed between the surface semiconductor layer 7A and the bottom semiconductor layer 8A, is set lower than the impurity concentration in the bottom semiconductor layer 8A. The impurity concentration in the region 9A decreases from the bottom surface side toward the top surface side. The peak of the impurity concentration in the region 9A is located at about its interface with the buried oxide layer 3. The value obtained by integrating the impurity concentration in the region 9A in the thickness direction is adjusted to approximately $1\times10^{12}$ to $5\times10^{12}$ cm$^{-2}$. Accordingly, the amount of electric charge in the region 9A is substantially the same as the amount of electric charge in the surface semiconductor layer 7A.

The semiconductor device 1F includes the gate dielectric layer 14 and the gate electrode 15. The gate electrode 15 faces via the gate dielectric layer 14 the n-type well semiconductor region 6A which isolates the source semiconductor region 10A from the region 9A. The gate electrode 15 is electrically connected to the gate terminal S. The semiconductor device 1F further includes the field oxide layer 16. The field oxide layer 16 is formed in the surface of the active layer 4A in such a manner as to be interposed between the n-type well semiconductor region 6A and the p-type well semiconductor region 5A. On a part of the surface of the field oxide layer 16 that is on the side to the n-type well semiconductor region 5A, there is formed the planer electrode 18. The planer electrode 18 is electrically connected to the drain electrode D.

As described above, parts of the surface semiconductor layer 7 and parts of the p-type well semiconductor region 5A are connected via a p-type semiconductor. According to the example shown in FIGS. 19 to 21, as shown in the plan view (see FIG. 19), the surface semiconductor layer 7A partially extends along the gate dielectric layer 14 to the p-type well semiconductor region 5A. More specifically, as shown in the plan view of FIG. 19, an end of the surface semiconductor layer 7A that is on the side to the p-type well semiconductor region 5A is formed with alternate projections and depressions. As shown in FIGS. 19 and 21, an end of a projection (projecting part) 71A has contact with the p-type well semiconductor region 5A. As shown in FIGS. 19 and 20, a depression 72A is distanced from the p-type well semiconductor region 5A.

With a structure having the above-described projections and depressions, when a predetermined gate voltage is applied to the gate electrode 15 to switch the semiconductor device 1F to the on state, carriers flow between the source semiconductor region 10A and the drain semiconductor region 11A via the projections 71A (see FIGS. 19 and 21), whereas no carrier flows therebetween via the depressions 72A (see FIGS. 19 and 20). The bold line arrow in FIG. 19 and the dashed line arrow in FIG. 21 indicate flows of carriers. The symbol "X" in FIG. 20 indicates no carrier flows.

More specifically, when a predetermined gate voltage is applied to the gate electrode 15, there is formed directly below the gate dielectric layer 14 a p-channel region 60a (a region directly below the gate dielectric layer 14 where the conductivity type is inverted from n-type to p-type). As shown in FIGS. 19 and 21, since the projections 71A have contact with the p-type well semiconductor region 5A, a current route is formed in the p-channel region 60a and the surface semiconductor layer 7A, which are of the same conductivity type (p-type), and a current flows through the current route between the source semiconductor region 10A and the drain semiconductor region 11A. That is, carriers present in the source semiconductor region 10A pass through the channel region 60a, the surface semiconductor layer 7A, the p-type well semiconductor region 5A, and the drain semiconductor region 11A.

Meanwhile, as shown in FIGS. 19 and 20, the depressions 72A have no contact with the p-type well semiconductor region 5A, but have contact with the first side region 92A. Since the conductivity types of the surface semiconductor layer 7A and the first side region 92A are opposite to each other (p-type and n-type, respectively), the current route is interrupted at the contact area between the surface semiconductor layer 7A and the first side region 92A, and thus no current flows between the source semiconductor region 10A and the drain semiconductor region 11A.

As described above, parts where currents flows and parts where no current flows are formed alternately in the semiconductor device 1F in the width direction (Y direction as shown in FIG. 19), and consequently, a current amount per unit area of the semiconductor device 1F can be reduced. The reduction in the current amount per unit area enables prevention of current crowding from occurring in the drain semiconductor region 11A as well as prevention of deterioration in forward breakdown voltage of the semiconductor device 1F.

Further, in the present embodiment, the contact semiconductor region is unnecessary, and thus the semiconductor device 1F can be downsized. More specifically, since the p-type well semiconductor region 5A and the surface semiconductor layer 7A have contact with each other by means of the projections 71A, the drain semiconductor region 11A and the surface semiconductor layer 7A have substantially the same electric potential, and thus there is no need to arrange a contact semiconductor region for causing the surface semiconductor layer 7A and the drain semiconductor region 11A to have the same electric potential.

Eighth Embodiment

An eighth embodiment of the present invention will be described with reference to the drawings.

Figure 22:
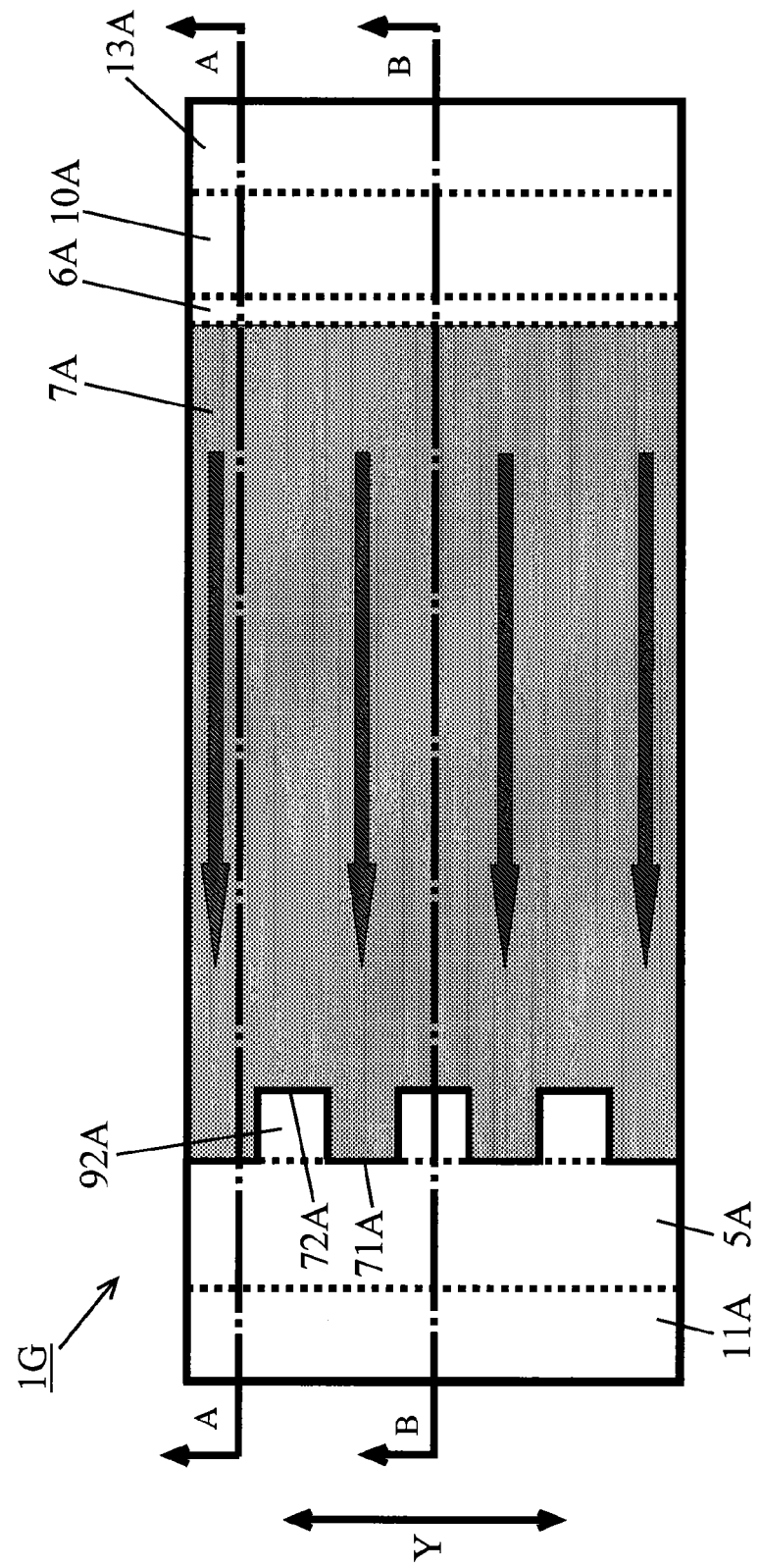
FIG. 22 is a plan view showing essential parts of a semiconductor device according to an eighth embodiment of present invention.
Figure 23:
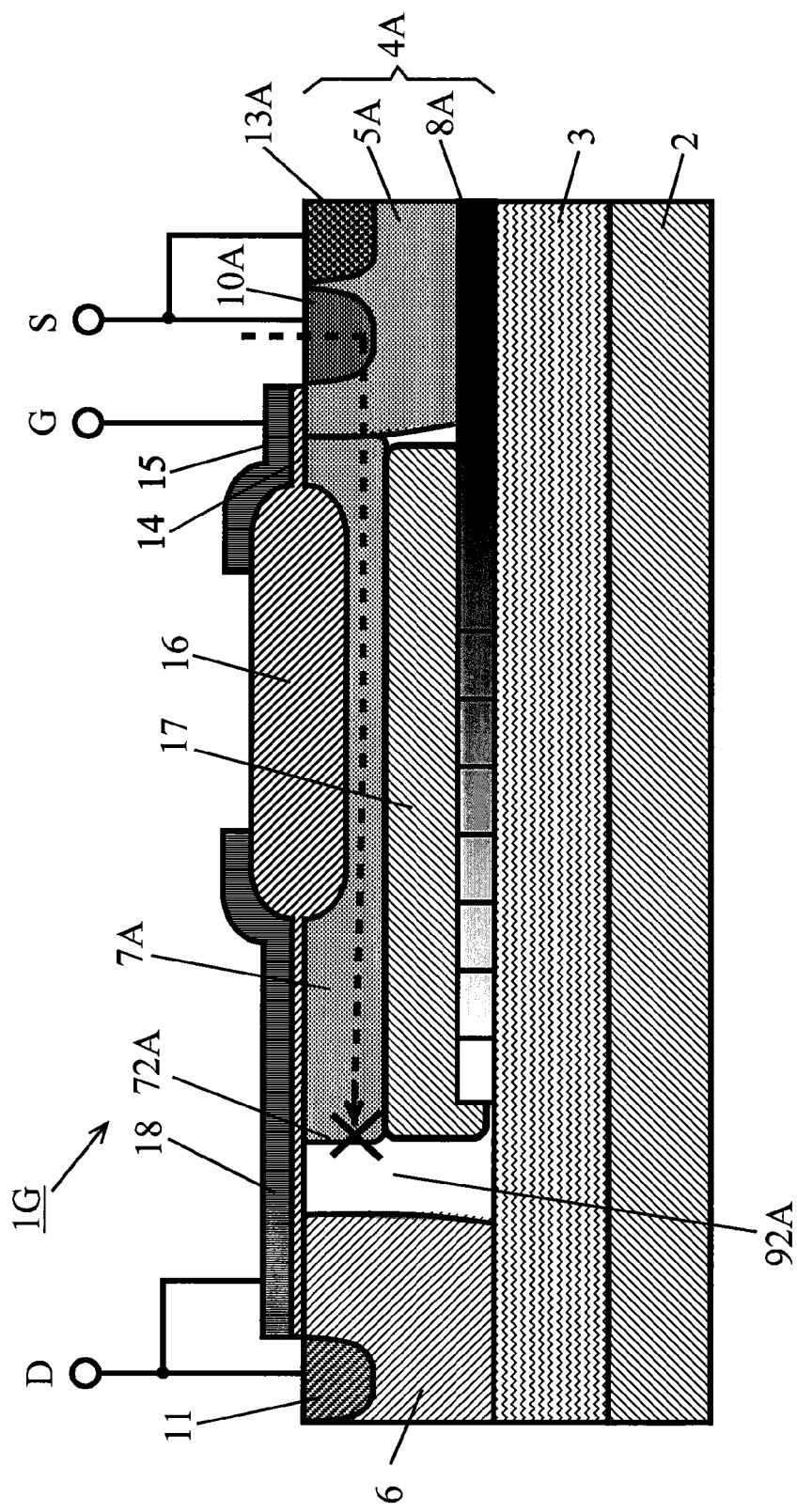
FIG. 23 is a cross-sectional view of the semiconductor device shown in FIG. 22 taken along line B-B.
Figure 24:
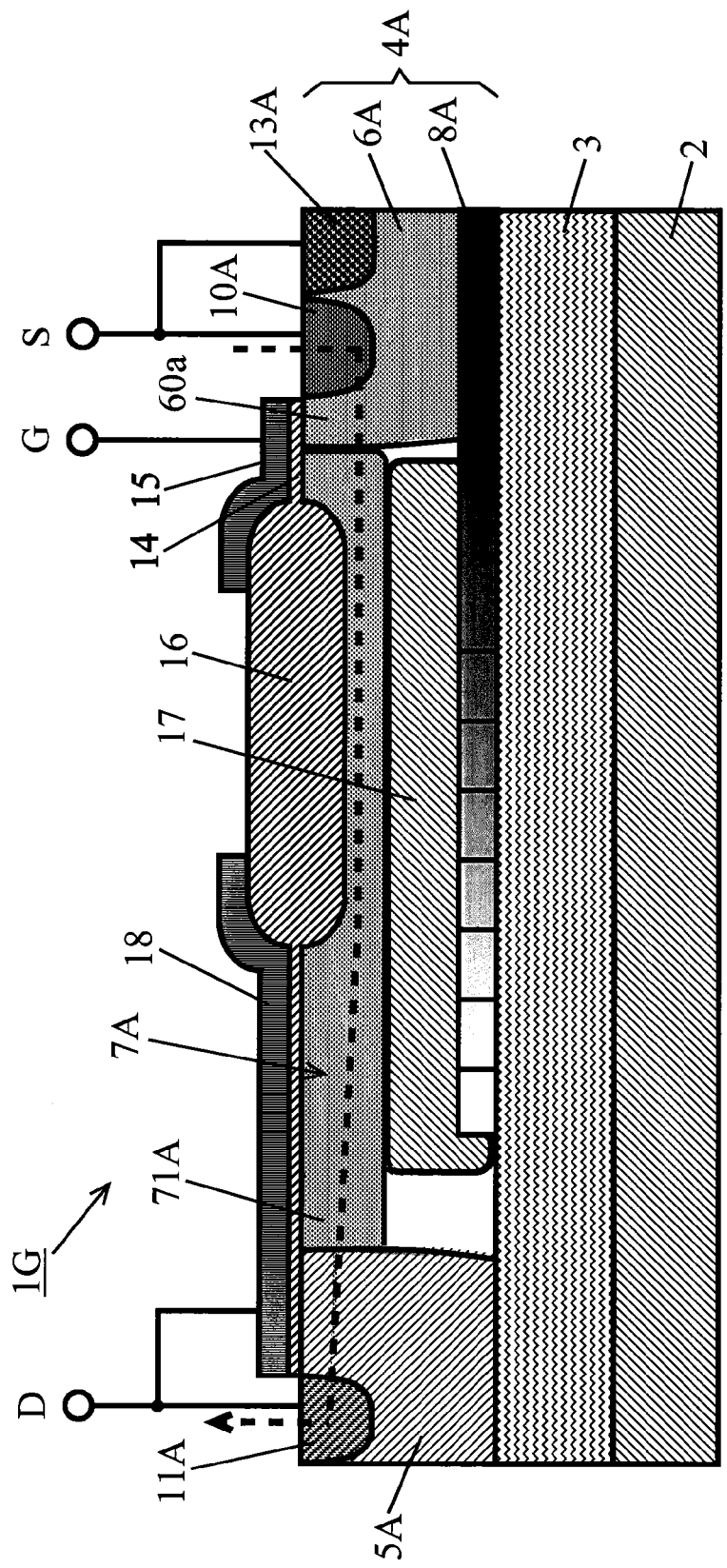
FIG. 24 is a cross-sectional view of the semiconductor device shown in FIG. 22 taken along line A-A.
Figure 25:
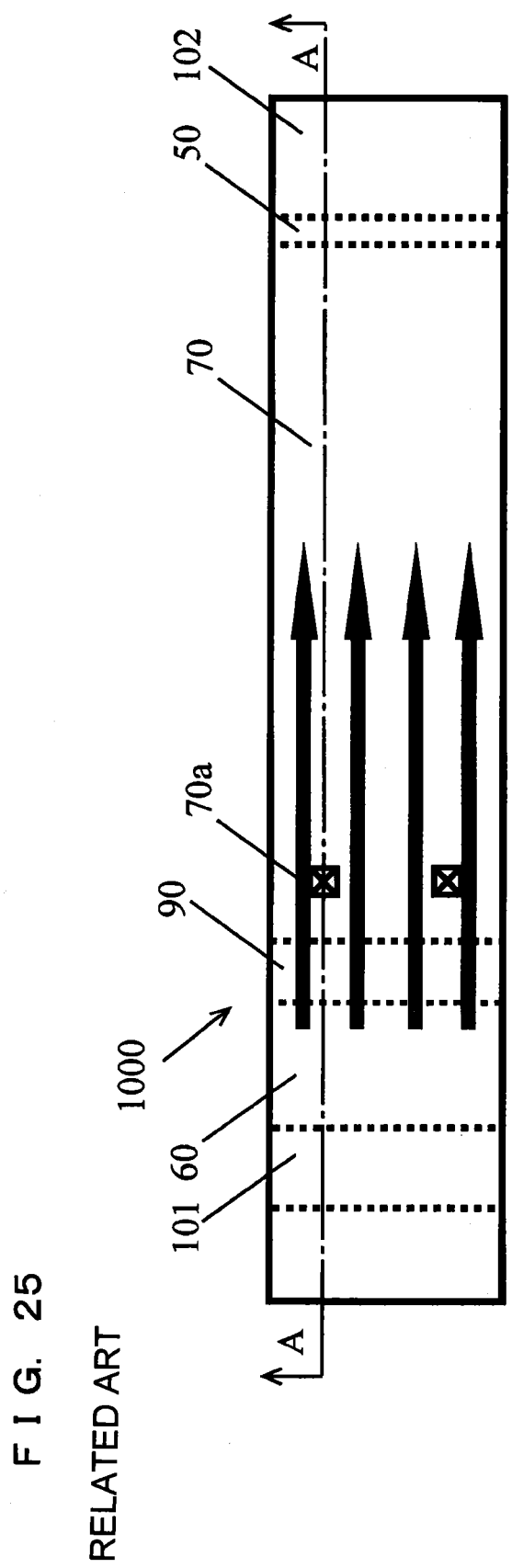
FIG. 25 is a plan view showing essential parts of a conventional semiconductor device.
Figure 26:
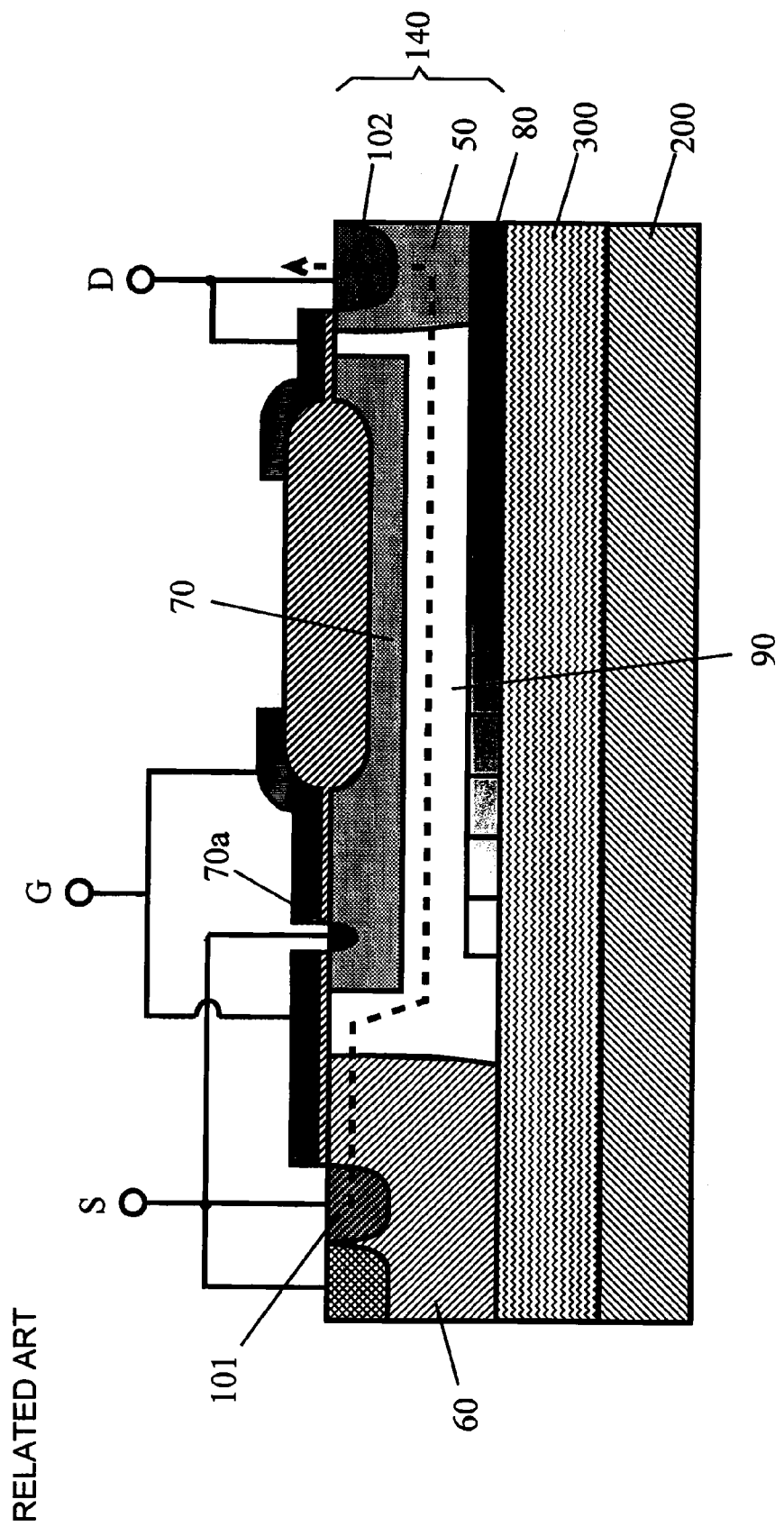
FIG. 26 is a cross-sectional view of the semiconductor device shown in FIG. 25 taken along line A-A.

FIG. 22 is a plan view showing essential parts of a semiconductor device according to an eighth embodiment of the present invention. FIG. 23 is a cross-sectional view of the semiconductor device shown in FIG. 22 taken along line B-B. FIG. 24 is a cross-sectional view of the semiconductor device shown in FIG. 22 taken along line A-A. It should be noted that no electrodes or field oxide layer are shown in FIG. 22. In the eighth embodiment, components that are identical to those in the seventh embodiment will be denoted by the corresponding identical reference characters, and no explanation will be given therefor.

In the eighth embodiment, an exemplary case will be described where the "first conductivity type" and the "second conductivity type" recited in the claims represent the n-type and the p-type, respectively.

A semiconductor device 1G according to the eighth embodiment is different from that according to the seventh embodiment in that a bottom semiconductor layer 17 is formed between the surface semiconductor layer 7A and the bottom semiconductor layer 8A.

Specifically, as shown in FIGS. 23 and 24, the active layer 4A includes the bottom semiconductor layer 17 instead of the main area 91A of the region 9A according to the seventh embodiment. The bottom semiconductor layer 17 has contact at its one end with the n-type well semiconductor region 6A. The bottom semiconductor layer 17 contains an n-type impurity (typically phosphorus). The impurity concentration is higher than the impurity concentration in the main area 91A of the region 9A described in the seventh embodiment. With this structure including the bottom semiconductor layer 17, it is possible to increase the concentration of the surface semiconductor layer 7A without causing deterioration in breakdown voltage, and also possible to reduce the on-resistance of the semiconductor device 1G.

INDUSTRIAL APPLICABILITY

The present invention is applicable to a semiconductor device or the like which is able to prevent deterioration in breakdown voltage caused by heat and which facilitates downsizing.

DESCRIPTION OF THE REFERENCE CHARACTERS 1, 1A to 1F lateral semiconductor device
2 semiconductor substrate
3 buried oxide layer
4 active layer
5 n-type well semiconductor region
6 p-type well semiconductor region
61 projection
62 depression
7 surface semiconductor layer
71 projection
72 depression
8 bottom semiconductor layer
9, 9A drift region
91, 91A projection
92, 92A depression
10, 10A source semiconductor region
11, 11A drain semiconductor region
13 well-contacting semiconductor region
14 gate dielectric layer
15 gate electrode
16 field oxide layer
17 bottom semiconductor layer

The invention claimed is:
1. A lateral semiconductor device comprising:
a semiconductor substrate;
a buried oxide layer formed on the semiconductor substrate; and
an active layer formed on the buried oxide layer, wherein
the active layer includes a first conductivity type well region, a second conductivity type well region, a first conductivity type drift region, and a second conductivity type surface layer,
the first conductivity type well region and the second conductivity type well region are separated via the first conductivity type drift region, such that the first conductivity type drift region is interposed between the first conductivity type well region and the second conductivity type well region, the first conductivity type well region and the second conductivity type well region having contact with the first conductivity type drift region,
the second conductivity type surface layer is formed in a part of a surface of the active layer, between the first conductivity type well region and the second conductivity type well region,
the second conductivity type surface layer has, on the second conductivity type well region side thereof, a first portion having contact with the second conductivity type well region and a second portion distanced from the second conductivity type well region by a part, of the first conductivity type drift region, that has contact with the second conductivity type well region being located between the second portion and the second conductivity type well region, the first portion and the second portion being alternately disposed when viewed in a plan view,
the first conductivity type well region surrounds a first conductivity type drain region, and
the second conductivity type well region surrounds a first conductivity type source region,
the lateral semiconductor device further comprising a gate dielectric layer and a gate electrode, wherein
the gate dielectric layer has, in a part of a surface of the active layer, contact with the second conductivity type well region, the first conductivity type drift region, and the second conductivity type surface layer, and
the gate electrode faces the second conductivity type well region via the gate dielectric layer.

2. The semiconductor device according to claim 1, wherein the first portion of the second conductivity type surface layer projects, having contact with the gate dielectric layer, toward the second conductivity type well region.

3. The semiconductor device according to claim 1, wherein the first portion of the second conductivity type surface layer has contact with a part, of the second conductivity type well region, that projects toward the second conductivity type surface layer.

4. A lateral semiconductor device comprising:
a semiconductor substrate;
a buried oxide layer formed on the semiconductor substrate; and
an active layer formed on the buried oxide layer, wherein
the active layer includes a first conductivity type well region, a second conductivity type well region, a first conductivity type drift region, and a second conductivity type surface layer,
the first conductivity type well region and the second conductivity type well region are separated via the first conductivity type drift region, such that the first conductivity type drift region is interposed between the first conductivity type well region and the second conductivity type well region, the first conductivity type well region and the second conductivity type well region having contact with the first conductivity type drift region,
the second conductivity type surface layer is formed in a part of a surface of the active layer, between the first conductivity type well region and the second conductivity type well region, the second conductivity type surface layer has, on the second conductivity type well region side thereof, a first portion having contact with the second conductivity type well region and a second portion distanced from the second conductivity type well region by a part of the first conductivity type drift region, that has contact with the second conductivity type well region being located between the second portion and the second conductivity type well region, the first portion and the second portion being alternately disposed when viewed in a plan view, the first conductivity type well region surrounds a second conductivity type collector region, and the second conductivity type well region surrounds a first conductivity type emitter region, the lateral semiconductor device further comprising a gate dielectric layer and a gate electrode, wherein the gate dielectric layer has, in a part of a surface of the active layer, contact with the second conductivity type well region, the first conductivity type drift region, and the second conductivity type surface layer, and the gate electrode faces the second conductivity type well region via the gate dielectric layer.

5. The semiconductor device according to claim 4, wherein the first portion of the second conductivity type surface layer projects, having contact with the gate dielectric layer, toward the second conductivity type well region.

6. A lateral semiconductor device comprising:

a semiconductor substrate;

a buried oxide layer formed on the semiconductor substrate; and an active layer formed on the buried oxide layer, wherein the active layer includes a first region, a second region, a third region, and a fourth region, the first region is a first conductivity type well region, the second region is a second conductivity type well region, the third region is a first conductive type semiconductor region via which the first conductivity type well region and the second conductivity type well region are separated, such that the first conductive type semiconductor region is interposed between the first conductivity type well region and the second conductivity type well region, the first conductivity type well region and the second conductivity type well region having contact with the third region, the fourth region is a second conductivity type surface layer formed in a part of a surface of the active layer, between the first conductivity type well region and the second conductivity type well region, the second conductivity type surface layer has, on the first conductivity type well region side thereof, contact with the first conductivity type well region, the second conductivity type surface layer has, on the second conductivity type well region side thereof, a first portion having contact with the second conductivity type well region and a second portion distanced from the second conductivity type well region by a part, of the third region, that has contact with the second conductivity type well region being located between the second portion and the second conductivity type well region, the first portion and the second portion being alternately disposed when viewed in a plan view, the first conductivity type well region surrounds a second conductivity type source region, and the second conductivity type well region surrounds a second conductivity type drain region, the lateral semiconductor device further comprising a gate dielectric layer and a gate electrode, wherein the gate dielectric layer has, in a part of a surface of the active layer, contact with the first conductivity type well region and the second conductivity type surface layer, and the gate electrode faces the first conductivity type well region via the gate dielectric layer.

7. The semiconductor device according to claim 6, wherein the first portion of the second conductivity type surface layer projects, having contact with the gate dielectric layer, toward the second conductivity type well region.

* * * * *